(12) United States Patent
Kim et al.

(10) Patent No.: US 11,722,048 B2
(45) Date of Patent: Aug. 8, 2023

(54) VOLTAGE GENERATING CIRCUITS INCLUDING ASSIST CIRCUITS AND OPERATING METHODS THEREOF

(71) Applicant: Samsung Electronics Co., Ltd., Suwon-si (KR)

(72) Inventors: Gyuseong Kim, Suwon-si (KR); Hyun-Jin Shin, Hwaseong-si (KR); Sanggyeong Won, Suwon-si (KR)

(73) Assignee: Samsung Electronics Co., Ltd.

(*) Notice: Subject to any disclaimer, the term of this patent is extended or adjusted under 35 U.S.C. 154(b) by 0 days.

(21) Appl. No.: 17/560,512

(22) Filed: Dec. 23, 2021

(65) Prior Publication Data

US 2022/0352807 A1    Nov. 3, 2022

(30) Foreign Application Priority Data

Apr. 28, 2021 (KR) .................. 10-2021-0055279

(51) Int. Cl.
*H02M 1/00* (2006.01)
*G11C 5/14* (2006.01)
*H02M 3/07* (2006.01)

(52) U.S. Cl.
CPC ........... *H02M 1/0045* (2021.05); *G11C 5/145* (2013.01); *H02M 3/07* (2013.01)

(58) Field of Classification Search
CPC ...... H02M 1/0045; H02M 1/007; H02M 3/07; H02M 3/077
See application file for complete search history.

(56) References Cited

U.S. PATENT DOCUMENTS

| | | | |
|---|---|---|---|
| 8,390,365 B2 | 3/2013 | Chang et al. | |
| 9,423,814 B2 | 8/2016 | Hu et al. | |
| 11,490,488 B2* | 11/2022 | Lee | H05B 45/3725 |
| 2003/0184362 A1* | 10/2003 | Kwon | G05F 1/565 |
| | | | 327/540 |
| 2008/0239802 A1* | 10/2008 | Thorp | G11C 5/145 |
| | | | 365/175 |
| 2009/0079492 A1* | 3/2009 | Wu | H03K 19/00369 |
| | | | 327/512 |
| 2009/0251961 A1 | 10/2009 | Nam et al. | |
| 2018/0323703 A1 | 11/2018 | Park et al. | |
| 2019/0080783 A1 | 3/2019 | Kim et al. | |

(Continued)

FOREIGN PATENT DOCUMENTS

| | | |
|---|---|---|
| KR | 100449266 B1 | 12/2004 |
| KR | 20090105684 A | 10/2009 |

(Continued)

*Primary Examiner* — Sibin Chen
(74) *Attorney, Agent, or Firm* — Myers Bigel, P.A.

(57) ABSTRACT

Provided a voltage generating circuits including assist circuits and operating methods thereof. The voltage generating circuit which includes an assist circuit that generates an assist signal indicating an enable mode or a disable mode. When a first power supply voltage is lower than an assist reference voltage, the assist signal indicates the enable mode, and a compensation circuit generates a compensation signal based on the first power supply voltage. An internal voltage converter generates a regulated voltage based on the first power supply voltage, and a charge pump circuit generates a pump voltage based on the regulated voltage. The compensation signal compensates for the regulated voltage.

19 Claims, 17 Drawing Sheets

121a

(56) References Cited

U.S. PATENT DOCUMENTS

2021/0036168 A1* 2/2021 Lu .................... H01L 27/0805
2021/0295785 A1* 9/2021 Huang ................ G09G 3/3233

FOREIGN PATENT DOCUMENTS

| KR | 20180123384 A | 11/2018 |
| KR | 20190029014 A | 3/2019 |
| KR | 20200067584 A | 6/2020 |

* cited by examiner

VOLTAGE GENERATING CIRCUITS INCLUDING ASSIST CIRCUITS AND OPERATING METHODS THEREOF

CROSS-REFERENCE TO RELATED APPLICATION

This application claims priority under 35 U.S.C. § 119 to Korean Patent Application No. 10-2021-0055279 filed on Apr. 28, 2021, in the Korean Intellectual Property Office, and the entire contents of the above-identified application are incorporated by reference herein.

TECHNICAL FIELD

Aspects of the present disclosure described herein relate to voltage generating circuits, and more particularly, relate to voltage generating circuits including assist circuits used in processing data of a memory device, and to operating methods thereof.

BACKGROUND

A memory device may store data in response to a write request and/or may output data stored therein in response to a read request. Memory devices may be classified as volatile memory devices, which may lose data stored therein when a power supply is turned off or disconnected, or as a non-volatile memory device, which retains data stored therein even when a power supply is turned off or disconnected. Examples of volatile memory devices include a dynamic random access memory (DRAM) device or a static RAM (SRAM) device, and examples of non-volatile memory devices include a flash memory device, a phase-change RAM (PRAM), a magnetic RAM (MRAM), or a resistive RAM (RRAM).

Non-volatile memory devices may include a plurality of memory cells. The non-volatile memory device may store data by adjusting a threshold voltage distribution of a plurality of memory cells. In general, a voltage higher than a power supply voltage may be required in a write operation for storing data. A separate circuit such as a charge pump circuit may be required to generate a high voltage. The charge pump circuit may cause an increase in the size of the non-volatile memory device.

SUMMARY

Aspects of the present disclosure provide voltage generating circuits including assist circuits and operating methods thereof.

According to some embodiments, a voltage generating circuit may include an assist circuit that generates an assist signal indicating an enable mode when a first power supply voltage is lower than an assist reference voltage. The voltage generating circuit may further include: a compensation circuit configured to generate a compensation signal based on the first power supply voltage when the assist signal indicates the enable mode; an internal voltage converter configured to generate a regulated voltage based on the first power supply voltage; and a charge pump circuit configured to generate a pump voltage based on the regulated voltage and based on the compensation signal. The compensation signal compensates for the regulated voltage.

According to some embodiments, a voltage generating circuit may include an assist circuit configured to generate an assist signal indicating an enable mode when a first power supply voltage is lower than an assist reference voltage. The voltage generating circuit may further include an internal voltage converter configured to generate a regulated voltage based on the first power supply voltage and the assist signal, and a charge pump circuit configured to generate a pump voltage based on the regulated voltage.

According to some embodiments, an operating method of a voltage generating circuit including an assist circuit may include determining, by the assist circuit, whether a power supply voltage is lower than an assist reference voltage; generating, by the assist circuit, an assist signal indicating an enable mode in response to determining that the power supply voltage is lower than the assist reference voltage; generating a regulated voltage based on the power supply voltage and the assist signal; and generating a pump voltage based on the regulated voltage.

BRIEF DESCRIPTION OF THE FIGURES

The above and other objects and features of the present disclosure will become apparent by describing in detail some example embodiments thereof with reference to the accompanying drawings.

DETAILED DESCRIPTION

Below, some example embodiments of the present disclosure will be described in detail and clearly to such an extent that one skilled in the art may easily carry out the present disclosure.

Figure 1:
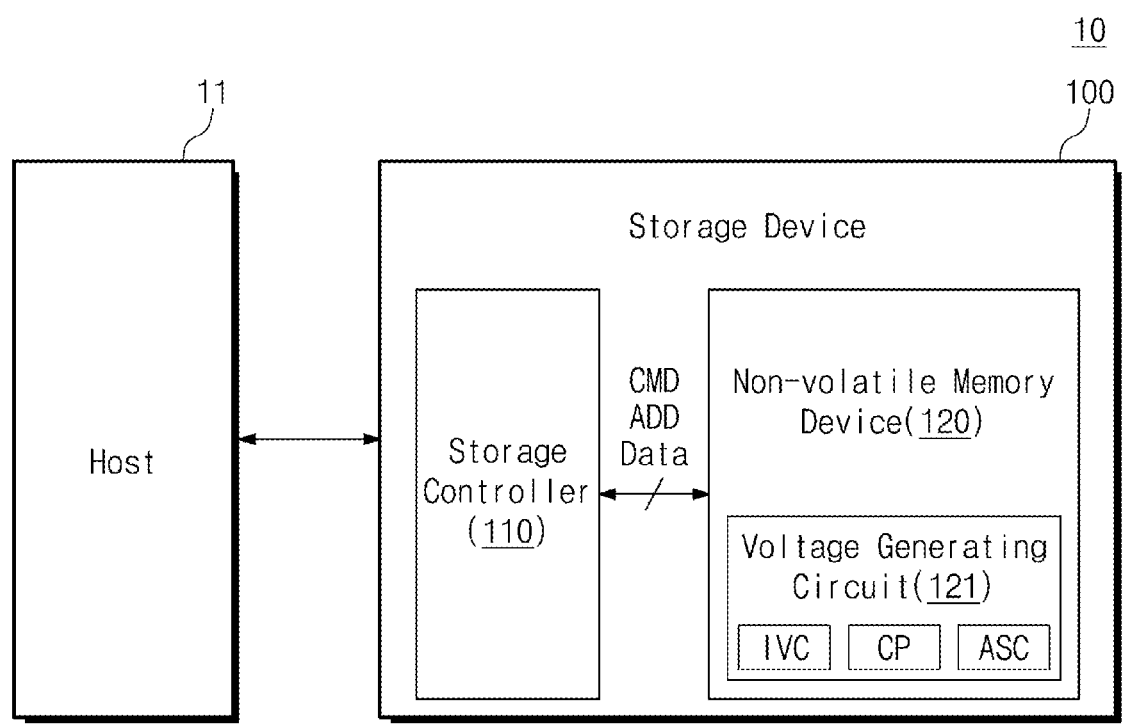
FIG. 1 is a block diagram of a storage system according to some embodiments of the present disclosure.

FIG. 1 is a block diagram of a storage system according to some embodiments of the present disclosure. Referring to FIG. 1, a storage system 10 may include a host 11 and a storage device 100. In some embodiments, the storage system 10 may be a computing system, which may be configured to process a variety of information, such as a personal computer (PC), a notebook, a laptop, a server, a workstation, a tablet PC, a smartphone, a digital camera, and a black box, as examples.

The host 11 may control overall operations of the storage system 10. For example, the host 11 may store data in the storage device 100 and/or may read data stored in the storage device 100.

The storage device 100 may include a storage controller 110 and a non-volatile memory device 120. The non-volatile memory device 120 may store data. The storage controller 110 may store data in the non-volatile memory device 120 and/or may read data stored in the non-volatile memory device 120. The non-volatile memory device 120 may operate under control of the storage controller 110. For example, based on a command CMD indicating an operation and an address ADD indicating a location of data, the storage controller 110 may store the data in the non-volatile memory device 120 or may read the data stored in the non-volatile memory device 120.

In some embodiments, the non-volatile memory device 120 may be a flash memory. For example, the non-volatile memory device 120 may be implemented based on a NOR flash memory and may be included in an integrated circuit (IC) or a microcontroller unit (MCU) as an embedded flash (eFlash) memory. Alternatively, the non-volatile memory device 120 may be implemented based on a NAND flash memory and may be included in a high-capacity storage medium such as a solid state drive (SSD). However, the present disclosure is not limited to the above examples. For example, the non-volatile memory device 120 may be one of various storage devices, which retain data stored therein even when a power is turned off or disconnected, such as a PRAM, an MRAM, a RRAM, and a FRAM.

The non-volatile memory device 120 may include a voltage generating circuit 121. The voltage generating circuit 121 may generate a voltage that is used for the non-volatile memory device 120 to internally process data. For example, the voltage generating circuit 121 may generate voltages that are used to process commands such as a write command and a read command.

The voltage generating circuit 121 may include an internal voltage converter IVC, a charge pump circuit CP, and an assist circuit ASC. The internal voltage converter IVC may perform a regulating operation based on a power supply voltage and may generate a regulated voltage. The regulating operation may indicate an operation of generating an electrical signal having a given voltage level. The charge pump circuit CP may receive the regulated voltage from the internal voltage converter IVC, may perform charge pumping based on the regulated voltage, and may generate a pump voltage. Herein, charge pumping may refer to an operation of amplifying a voltage.

In some embodiments, the pump voltage of the charge pump circuit CP may be higher than or greater the power supply voltage. For example, the pump voltage may be a voltage that is used for a write operation of the non-volatile memory device 120.

In some embodiments, the charge pumping of the charge pump circuit CP may be restricted by the size of the charge pump circuit CP and the regulated voltage of the internal voltage converter IVC. For example, a voltage drop may occur due to the regulating operation of the internal voltage converter IVC, and the regulated voltage may be lower than the power supply voltage. The pump voltage generated by the charge pump circuit CP may be restricted depending on a driving current received from the internal voltage converter IVC (e.g., a current capacity of the internal voltage converter IVC), the size(s) of transistors in the charge pump circuit CP, the number of transistors in the charge pump circuit CP, or the like.

The size of the charge pump circuit CP may be increased in order for the charge pump circuit CP to generate the pump voltage having a high voltage. However, the increase in the size of the charge pump circuit CP may cause an increase in the size of the non-volatile memory device 120, thereby hindering the miniaturization and high integration. As such, it is desirable to increase the regulated voltage of the internal voltage converter IVC or increase a driving current to be provided to the charge pump circuit CP, without increasing the size of the charge pump circuit CP.

The assist circuit ASC may assist the regulating operation of the internal voltage converter IVC. For example, the assist circuit ASC may detect whether the power supply voltage is lower than an assist reference voltage. The assist reference voltage may be used to determine whether to compensate for the regulated voltage of the internal voltage converter IVC. When the power supply voltage is lower than the assist reference voltage, the assist circuit ASC may compensate for a voltage drop of the internal voltage converter IVC or may increase a driving current to be provided to the charge pump circuit CP. The voltage generating circuit 121 will be described in more detail with reference to FIGS. 4 to 11.

As described above, according to the present disclosure, the voltage generating circuit 121 that compensates for the regulated voltage of the internal voltage converter IVC through the assist circuit ASC and thus generates a pump voltage having a high voltage may be provided without increasing the size of the charge pump circuit CP.

Figure 2:
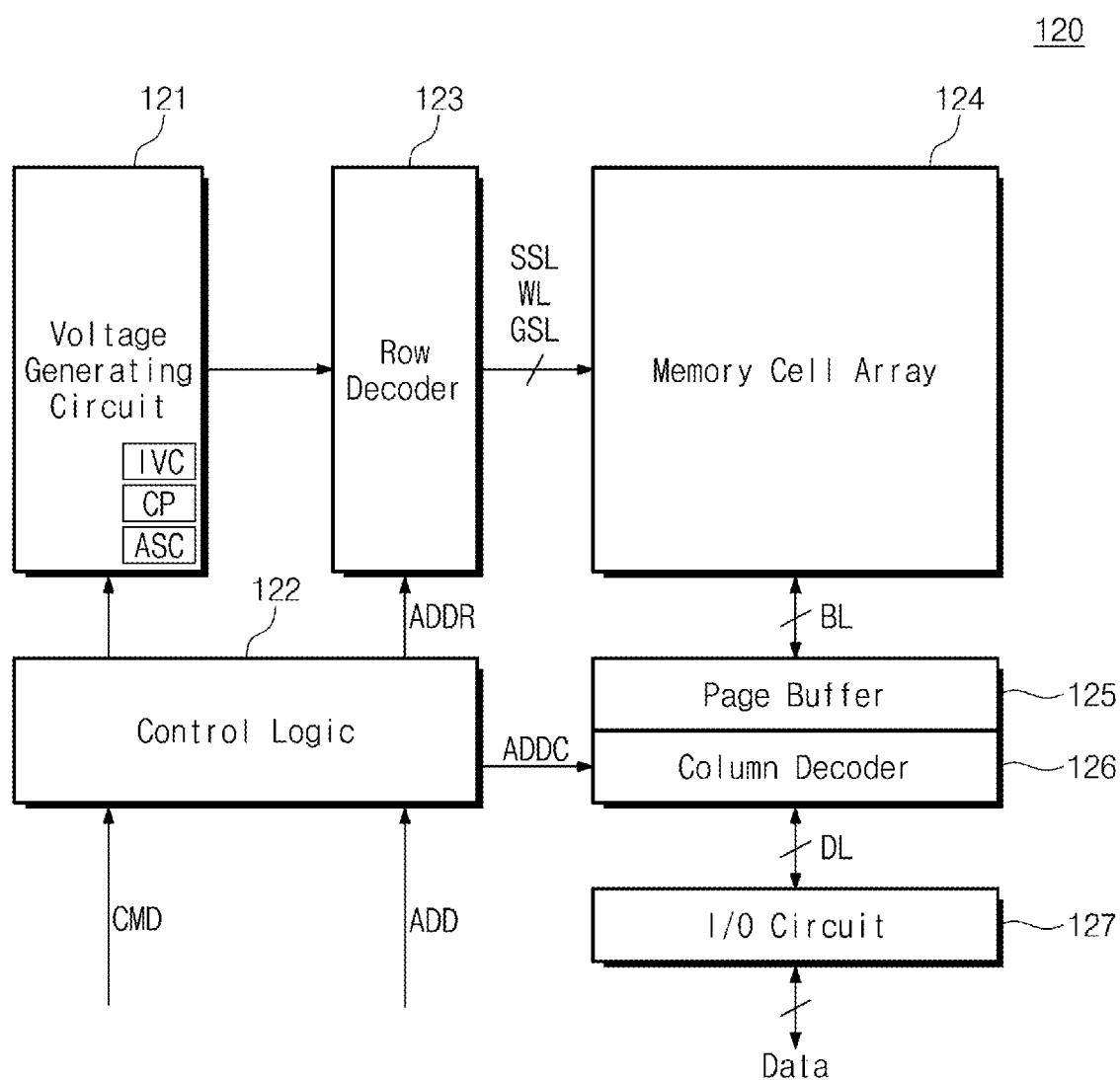
FIG. 2 is a block diagram illustrating a non-volatile memory device of FIG. 1 in detail, according to some embodiments of the present disclosure.

FIG. 2 is a block diagram illustrating a non-volatile memory device of FIG. 1 in greater detail, according to some embodiments of the present disclosure. Referring to FIGS. 1 and 2, the non-volatile memory device 120 may communicate with the storage controller 110. For example, the non-volatile memory device 120 may receive the address ADD and the command CMD from the storage controller 110. The non-volatile memory device 120 may exchange data with the storage controller 110.

The non-volatile memory device 120 may include the voltage generating circuit 121, control logic 122, a row decoder 123, a memory cell array 124, a page buffer 125, a column decoder 126, and an input/output (I/O) circuit 127.

The control logic 122 may receive the command CMD and the address ADD from the storage controller 110. The command CMD may refer to a signal that directs an operation to be performed by the non-volatile memory device 120, such as a read operation, a write operation, or an erase operation. The address ADD may include a row address ADDR and a column address ADDC. The control logic 122 may control the voltage generating circuit 121, the row decoder 123, and the column decoder 126, based on the command CMD and the address ADD. For example, the control logic 122 may control the voltage generating circuit 121 to generate a voltage corresponding to the command CMD and may output the row address ADDR and the column address ADDC to the row decoder 123 and the column decoder 126, respectively.

The voltage generating circuit 121 may control a voltage that is applied to the memory cell array 124 through the row decoder 123. The voltage generating circuit 121 may include the internal voltage converter IVC, the charge pump circuit CP, and the assist circuit ASC. In some embodiments, under control of the control logic 122, the voltage generating circuit 121 may generate a pump voltage to be used in the write operation, through the internal voltage converter IVC, the charge pump circuit CP, and the assist circuit ASC.

The row decoder 123 may receive the row address ADDR from the control logic 122. The row decoder 123 may be connected with the memory cell array 124 through string selection lines SSL, word lines WL, and ground selection lines GSL. The row decoder 123 may decode the row address ADDR and may control voltages to be applied to the string selection lines SSL, the word lines WL, and the ground selection lines GSL based on a decoding result and a voltage received from the voltage generating circuit 121.

The memory cell array 124 may include a plurality of memory cells. Each of the plurality of memory cells may store data. Each of the plurality of memory cells may output data stored therein.

The page buffer 125 may be connected with the memory cell array 124 through bit lines BL. The page buffer 125 may read data from the memory cell array 124 in units of pages (that is, on a page-by-page basis), by sensing voltages of the bit lines BL. The column decoder 126 may receive the column address ADDC from the control logic 122. The column decoder 126 may decode the column address ADDC and may provide the data read by the page buffer 125 to the I/O circuit 127 based on a decoding result.

The column decoder 126 may receive data from the I/O circuit 127 through data lines DL. The column decoder 126 may receive the column address ADDC from the control logic 122. The column decoder 126 may decode the column address ADDC and may provide the data received from the I/O circuit 127 to the page buffer 125 based on a decoding result. The page buffer 125 may store the data provided from the I/O circuit 127 in the memory cell array 124 through the bit lines BL in units of pages (that is, on a page-by-page basis).

The I/O circuit 127 may be connected with the column decoder 126 through the data lines DL. The I/O circuit 127 may provide data received from the storage controller 110 to the column decoder 126 through the data lines DL. The I/O circuit 127 may output data received through the data lines DL to the storage controller 110.

Figure 3:
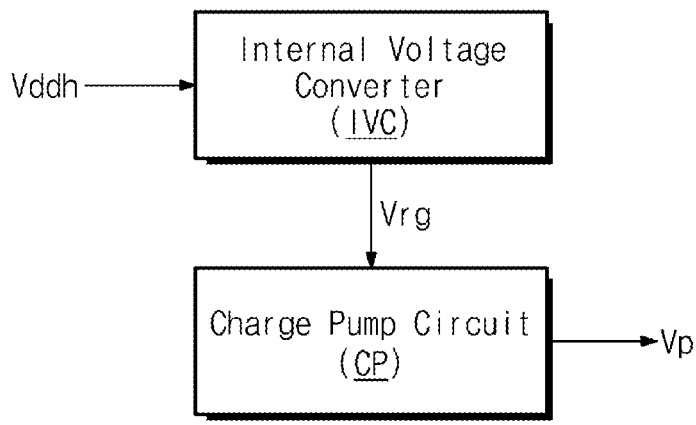
FIG. 3 is a block diagram illustrating a conventional voltage generating circuit.

FIG. 3 is a block diagram illustrating a conventional voltage generating circuit. The voltage generating circuit VGC may correspond to the voltage generating circuit 121 of FIGS. 1 and 2. The voltage generating circuit VGC may include the internal voltage converter IVC and the charge pump circuit CP.

The internal voltage converter IVC may receive a first power supply voltage Vddh. The first power supply voltage Vddh may be a power supply voltage for driving a non-volatile memory device including the voltage generating circuit VGC. For example, the first power supply voltage Vddh may be a voltage provided from the host 11 of FIG. 1, and may be used to drive the non-volatile memory device 120 of FIG. 1.

The internal voltage converter IVC may perform a regulating operation based on the first power supply voltage Vddh and may generate a regulated voltage Vrg. In some embodiments, the regulated voltage Vrg may be lower than the first power supply voltage Vddh. For example, the internal voltage converter IVC may include a plurality of transistors that are used for the regulating operation. A voltage drop such as an IR drop may occur due to a current passing through the transistors of the internal voltage converter IVC. As such, the internal voltage converter IVC may have a driving margin between the first power supply voltage Vddh and the regulated voltage Vrg. As the driving margin increases, a range of the first power supply voltage Vddh for driving the voltage generating circuit VGC may decrease.

The charge pump circuit CP may receive the regulated voltage Vrg from the internal voltage converter IVC. The charge pump circuit CP may perform charge pumping based on the regulated voltage Vrg and may generate a pump voltage Vp. The pump voltage Vp may be used for data processing of the non-volatile memory device. For example, the pump voltage Vp of the charge pump circuit CP may be applied to the memory cell array 124 of FIG. 2 through the row decoder 123 of FIG. 2.

In some embodiments, the pump voltage Vp that is generated by the charge pump circuit CP may be restricted by the size of the charge pump circuit CP, the regulated voltage Vrg of the internal voltage converter IVC, and/or a driving current received from the internal voltage converter IVC. Because an increase in the size of the charge pump circuit CP causes an increase in the size of the non-volatile memory device 120, it is desirable to increase the regulated voltage Vrg by assisting the internal voltage converter IVC or to increase a driving current to be provided to the charge pump circuit CP without an increase in the size of the charge pump circuit CP.

As described above, in the conventional voltage generating circuit VGC, the pump voltage Vp may be restricted by the voltage drop of the internal voltage converter IVC and the limited size of the charge pump circuit CP. The inventive concepts of the present disclosure provide a separate circuit that assists the internal voltage converter IVC to provide the pump voltage Vp being a high voltage. This will be more fully described with reference to FIGS. 4 to 11.

Figure 4:
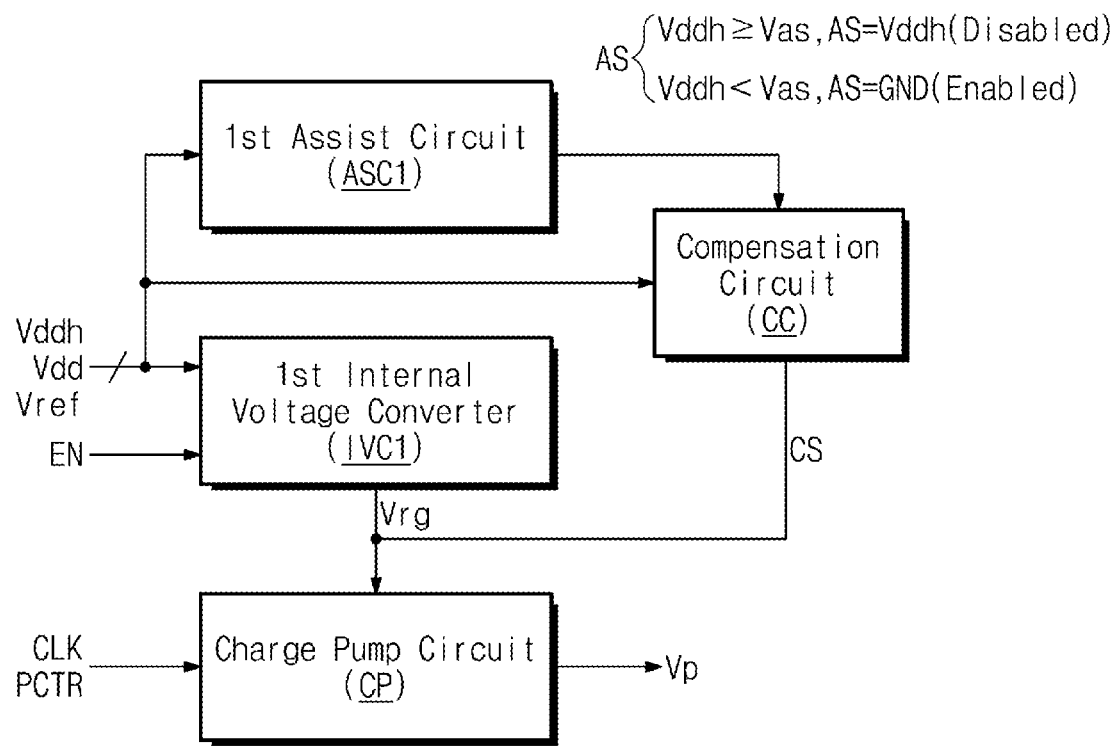
FIG. 4 is a block diagram describing a voltage generating circuit according to some embodiments of the present disclosure.

FIG. 4 is a block diagram describing a voltage generating circuit according to some embodiments of the present disclosure. A block diagram of a voltage generating circuit 121a is illustrated in FIG. 4. The voltage generating circuit 121a may correspond to the voltage generating circuit 121 of FIGS. 1 and 2. The voltage generating circuit 121a may include a first internal voltage converter IVC1, the charge pump circuit CP, a first assist circuit ASC1, and a compensation circuit CC. Unlike the voltage generating circuit VGC of FIG. 3, the voltage generating circuit 121a may further include the first assist circuit ASC1 and the compensation circuit CC.

The voltage generating circuit 121a may receive the first power supply voltage Vddh, a second power supply voltage Vdd, a reference voltage Vref, an enable signal EN, a clock signal CLK, and a pump control signal PCTR. The first and second power supply voltages Vddh and Vdd may be power supply voltages for driving a non-volatile memory device that includes the voltage generating circuit 121a. The second power supply voltage Vdd may be lower than the first power supply voltage Vddh. The reference voltage Vref may be used to determine a voltage level of the regulated voltage Vrg. The enable signal EN may be a signal that controls the regulating operation of the first internal voltage converter IVC1. The clock signal CLK may be used to control an operation timing of transistors included in the charge pump circuit CP. The pump control signal PCTR may be used to control charge pumping of the charge pump circuit CP.

Referring to FIGS. 1, 2, and 4, in some embodiments, the first and second power supply voltages Vddh and Vdd and the reference voltage Vref may be voltages provided from the host 11 and may be used to drive the non-volatile memory device 120. The enable signal EN, the clock signal CLK, and the pump control signal PCTR may be signals provided from the control logic 122. The voltage generating circuit 121a may generate the pump voltage Vp based on the first power supply voltage Vddh, the second power supply voltage Vdd, the reference voltage Vref, the enable signal EN, the clock signal CLK, and the pump control signal PCTR. The voltage generating circuit 121a may provide the pump voltage Vp to the memory cell array 124 through the row decoder 123.

Returning to FIG. 4, the first internal voltage converter IVC1 may receive the first and second power supply voltages Vddh and Vdd, the reference voltage Vref, and the enable signal EN. The first internal voltage converter IVC1 may use the first and second power supply voltages Vddh and Vdd as driving voltages. The first internal voltage converter IVC1 may generate the regulated voltage Vrg having a voltage level corresponding to the reference voltage Vref, in response to the enable signal EN. The first internal voltage converter IVC1 may output the regulated voltage Vrg to the charge pump circuit CP. A node at which the regulated voltage Vrg is generated may be connected with the compensation circuit CC and the charge pump circuit CP.

The first assist circuit ASC1 may receive the first power supply voltage Vddh, the second power supply voltage Vdd, and the reference voltage Vref. The first assist circuit ASC1 may include an assist reference voltage Vas. The first assist circuit ASC1 may compare the first power supply voltage Vddh and the assist reference voltage Vas. The first assist circuit ASC1 may generate an assist signal AS based on a comparison result of the first power supply voltage Vddh and the assist reference voltage Vas. The first assist circuit ASC1 may output the assist signal AS to the compensation circuit CC.

In some embodiments, the first assist circuit ASC1 may generate the assist signal AS indicating an enable mode or a disable mode. The enable mode may indicate a mode in which compensation is made for the regulated voltage Vrg of the first internal voltage converter IVC1. The disable mode may indicate a mode in which compensation is not made for the regulated voltage Vrg of the first internal voltage converter IVC1.

In some embodiments, when the first power supply voltage Vddh is lower than the assist reference voltage Vas, the first assist circuit ASC1 may generate the assist signal AS indicating the enable mode. For example, a voltage level of the assist signal AS indicating the enable mode may be a voltage level of a ground voltage GND.

In some embodiments, when the first power supply voltage Vddh is greater than or equal to the assist reference voltage Vas, the first assist circuit ASC1 may generate the assist signal AS indicating the disable mode. For example, a voltage level of the assist signal AS indicating the disable mode may be a voltage level of the first power supply voltage Vddh.

The compensation circuit CC may receive the first power supply voltage Vddh. The compensation circuit CC may receive the assist signal AS from the first assist circuit ASC1. The compensation circuit CC may generate a compensation signal CS based on the first power supply voltage Vddh and the assist signal AS. The compensation signal CS may be provided to the node at which the regulated voltage Vrg is generated. The compensation signal CS may compensate for the regulated voltage Vrg. For example, the compensation signal CS may compensate for a voltage drop of the first internal voltage converter IVC1.

In some embodiments, the compensation circuit CC may operate in the enable mode or the disable mode based on the assist signal AS. For example, when the assist signal AS indicates the enable mode, the compensation circuit CC may compensate for the regulated voltage Vrg through the compensation signal CS. When the assist signal AS indicates the disable mode, the compensation circuit CC may not output the compensation signal CS.

In some embodiments, the compensation circuit CC may decrease a driving margin of the first internal voltage converter IVC1. In general, while the first internal voltage converter IVC1 performs the regulating operation, a current may flow into the first internal voltage converter IVC1, and a voltage drop such as an IR drop may occur. The compensation circuit CC may compensate for the voltage drop of the first internal voltage converter IVC1 through the compensation signal CS. As such, the first internal voltage converter IVC1 may decrease or omit (or remove) the driving margin.

As the driving margin decreases, the first internal voltage converter IVC1 may operate (e.g., normally operate) even at the first power supply voltage Vddh having a lower voltage level. In other words, as the compensation for the voltage drop is made through the compensation signal CS, a range of the first power supply voltage Vddh in which the first internal voltage converter IVC1 operates may increase or widen.

The charge pump circuit CP may receive the clock signal CLK and the pump control signal PCTR. The charge pump circuit CP may receive the regulated voltage Vrg from the first internal voltage converter IVC1. The regulated voltage Vrg may be compensated for by the compensation signal CS of the compensation circuit CC. The charge pump circuit CP may generate the pump voltage Vp based on the clock signal CLK, the pump control signal PCTR, and the regulated voltage Vrg.

In some embodiments, the charge pump circuit CP may perform charge pumping based on driving currents provided from the first internal voltage converter IVC1 and the compensation circuit CC. For example, the first internal voltage converter IVC1 may provide a driving current corresponding to a current capacity (e.g., a transistor size or the number of transistors) to the charge pump circuit CP. In the case where the intensity or magnitude of driving current is weak, a voltage level of the regulated voltage Vrg may decrease, and thus, the pump voltage Vp may fail to reach a target voltage level of the charge pumping. In this case, the compensation circuit CC may further provide a driving current to the charge pump circuit CP through the compensation signal CS such that the charge pumping of the charge pump circuit CP may be smoothly performed. That is, the compensation circuit CC may compensate for a current capacity of the first internal voltage converter IVC1.

In some embodiments, for the write operation of the non-volatile memory device, the charge pump circuit CP may provide the pump voltage Vp and a driving current. For example, in the case of performing the write operation, in the memory cell array 124 of FIG. 2, memory cells, which are connected with bit lines BL associated with the write operation, from among memory cells sharing the same word line WL may require the pump voltage Vp and the driving current. As the number of memory cells associated with the write operation increases, the amount of necessary driving current may increase. A current driving capacity in which the charge pump circuit CP provides a driving current may be determined predominately by the regulated voltage Vrg. When the regulated voltage Vrg is lower than a target voltage level, the current driving capacity of the charge pump circuit CP may be reduced, and the reliability of the write operation may decrease. As the compensation for the regulated voltage Vrg is made by the compensation circuit CC, a decrease in the reliability of the write operation may be prevented.

As described above, according to some embodiments of the present disclosure, there may be provided the voltage generating circuit 121a that compensates for the regulated voltage Vrg of the first internal voltage converter IVC1 through the first assist circuit ASC1. Because the voltage drop is compensated for, the driving margin may be minimized, and thus, the first internal voltage converter IVC1 may operate at the first power supply voltage Vddh within a wider input range. Also, while improving a voltage level of the regulated voltage Vrg and maintaining an identical voltage level requirement of the pump voltage Vp, the size of the charge pump circuit CP may be minimized, and thus, the overall size of the voltage generating circuit 121a may decrease.

Figure 5:
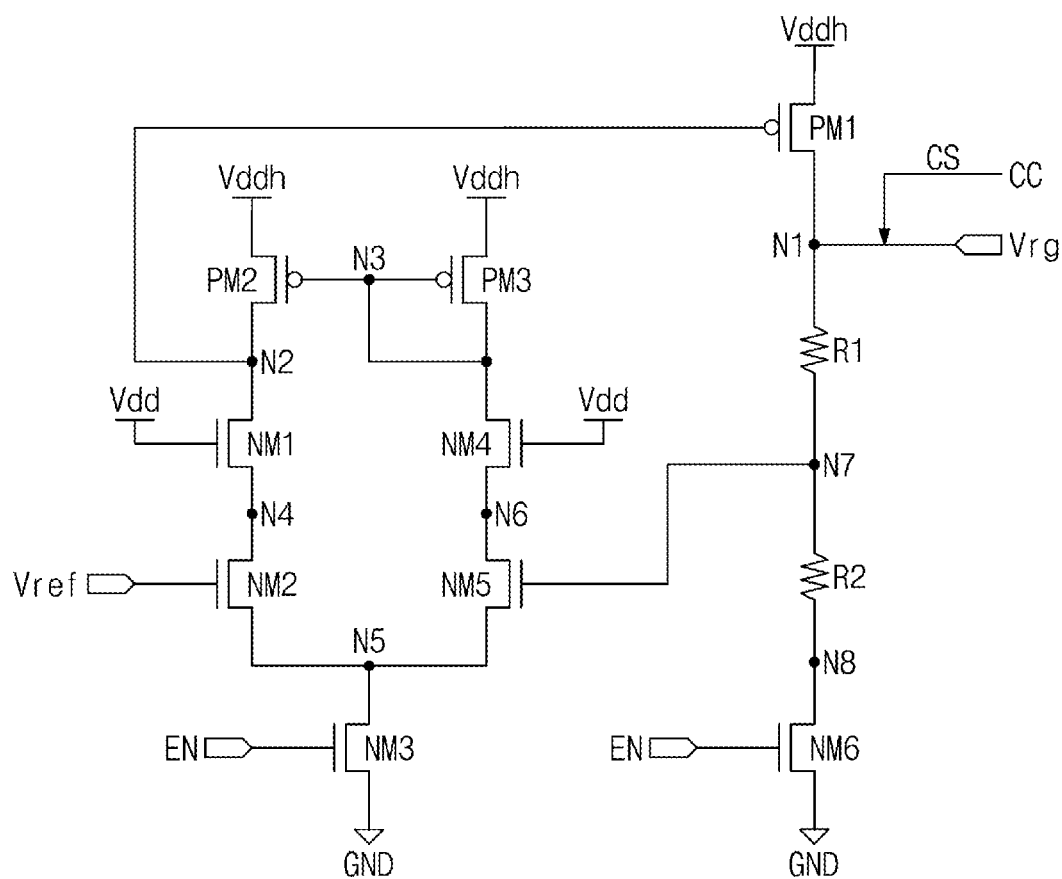
FIG. 5 is a circuit diagram illustrating a first internal voltage converter of FIG. 4 in detail, according to some embodiments of the present disclosure.

FIG. 5 is a circuit diagram illustrating a first internal voltage converter of FIG. 4 in greater detail, according to some embodiments of the present disclosure. Returning to FIGS. 4 and 5, the first internal voltage converter IVC1 may receive the first and second power supply voltages Vddh and Vdd, the reference voltage Vref, and the enable signal EN. The first internal voltage converter IVC1 may generate the regulated voltage Vrg. A first node N1 at which the regulated voltage Vrg is generated may be connected with the compensation circuit CC and the charge pump circuit CP. The first node N1 may be configured to receive the compensation signal CS from the compensation circuit CC.

The first internal voltage converter IVC1 may include first, second, and third PMOS transistors PM1, PM2, and PM3, first, second, third, fourth, fifth, and sixth NMOS transistors NM1, NM2, NM3, NM4, NM5, and NM6, and first and second resistors R1 and R2.

The first PMOS transistor PM1 may be connected between the first node N1 and a power node configured to receive the first power supply voltage Vddh. The first node N1 may be a node at which the regulated voltage Vrg is generated. The first PMOS transistor PM1 may operate in response to a voltage of a second node N2.

The second PMOS transistor PM2 may be connected between the second node N2 and the power node configured to receive the first power supply voltage Vddh. The second PMOS transistor PM2 may operate in response to a voltage of a third node N3.

The third PMOS transistor PM3 may be connected between the power node configured to receive the first power supply voltage Vddh and the third node N3. The third PMOS transistor PM3 may operate in response to a voltage of the third node N3.

The first NMOS transistor NM1 may be connected between the second node N2 and a fourth node N4. The first NMOS transistor NM1 may operate in response to the second power supply voltage Vdd.

The second NMOS transistor NM2 may be connected between the fourth node N4 and a fifth node N5. The second NMOS transistor NM2 may operate in response to the reference voltage Vref.

The third NMOS transistor NM3 may be connected between the fifth node N5 and a ground node having the ground voltage GND. The third NMOS transistor NM3 may operate in response to the enable signal EN.

The fourth NMOS transistor NM4 may be connected between the third node N3 and a sixth node N6. The fourth NMOS transistor NM4 may operate in response to the second power supply voltage Vdd.

The fifth NMOS transistor NM5 may be connected between the sixth node N6 and the fifth node N5. The fifth NMOS transistor NM5 may operate in response to a voltage of a seventh node N7.

The first resistor R1 may be connected between the first node N1 and the seventh node N7. The second resistor R2 may be connected between the seventh node N7 and an eighth node N8.

The sixth NMOS transistor NM6 may be connected between the eighth node N8 and the ground node having the ground voltage GND. The sixth NMOS transistor NM6 may operate in response to the enable signal EN.

In some embodiments, the first internal voltage converter IVC1 may generate the regulated voltage Vrg based on a feedback path. In more detail, the first PMOS transistor PM1 may generate the regulated voltage Vrg at the first node N1 based on a voltage of the second node N2. The regulated voltage Vrg on the first node N1 may have an influence on a voltage of the second node N2 through the remaining elements PM2, PM3, NM1, NM2, NM3, NM4, NM5, NM6, R1, and R2 of the first internal voltage converter IVC1. That is, the first PMOS transistor PM1 may generate the regulated voltage Vrg at the first node N1 based on a feedback path in which an output has an influence on an input.

The first internal voltage converter IVC1 may maintain (e.g., may uniformly maintain) a voltage level of the regulated voltage Vrg through the feedback path. For example, a voltage of the first node N1 at which the regulated voltage Vrg is generated may have an influence on a voltage of the second node N2 through the feedback path. As a voltage level of the second node N2 becomes higher, a current driving capacity of the first PMOS transistor PM1 may be restricted. In the case where a voltage level of the first power supply voltage Vddh is low, the current driving capacity of the first PMOS transistor PM1 may decrease, thereby causing a voltage drop of the regulated voltage Vrg. However, as the compensation circuit CC compensates for the voltage drop through the compensation signal CS (e.g., as the compensation circuit CC provides a driving current to the first node N1), the first internal voltage converter IVC1 may generate the regulated voltage Vrg whose voltage level is similar to the voltage level of the first power supply voltage Vddh.

In some embodiments, the first internal voltage converter IVC1 may have a restricted current capacity. For example, a voltage level of the second node N2 may be determined by the second PMOS transistor PM2 operating in a saturation region and the first NMOS transistor NM1 operating in a saturation region. The second node N2 may be connected with a gate terminal of the first PMOS transistor PM1. The current driving capacity of the first PMOS transistor PM1 may be restricted by the voltage level of the second node N2. A driving current that the first internal voltage converter IVC1 is capable of providing to the charge pump circuit CP may be restricted by the current driving capacity of the first PMOS transistor PM1.

To compensate for the restricted current capacity of the first internal voltage converter IVC1, the compensation circuit CC may provide the compensation signal CS to the first node N1. The compensation signal CS may correspond to a driving current that is introduced to the first node N1. The charge pump circuit CP may perform charge pumping based on the compensation signal CS and a drain current of the first PMOS transistor PM1. The compensation circuit CC will be described in more detail with reference to FIG. 7.

Figure 6:
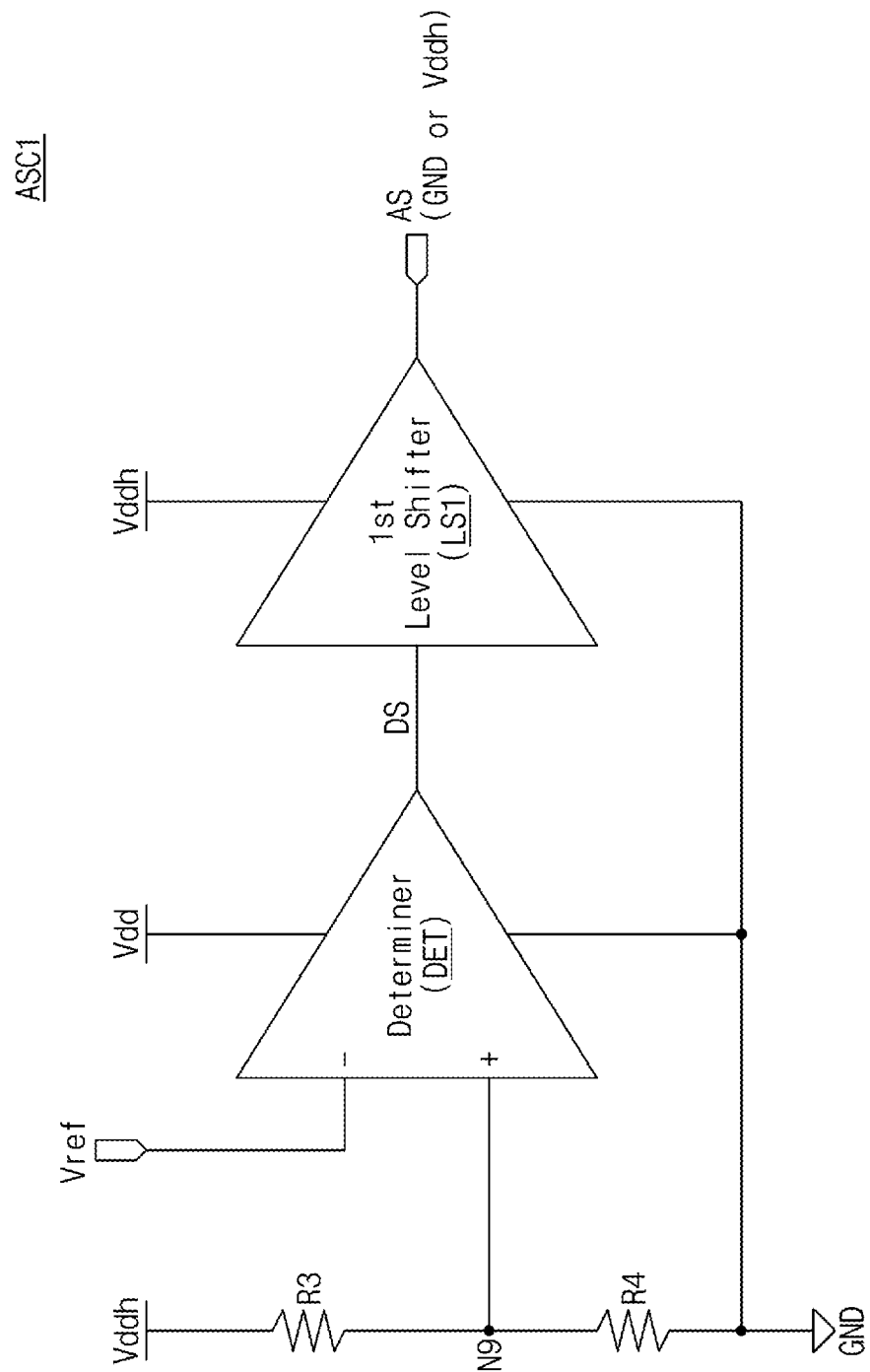
FIG. 6 is a circuit diagram illustrating an assist circuit of FIG. 4 in detail, according to some embodiments of the present disclosure.

FIG. 6 is a circuit diagram illustrating a first assist circuit of FIG. 4 in greater detail, according to some embodiments of the present disclosure. Referring to FIGS. 4 and 6, the first assist circuit ASC1 may receive the first power supply voltage Vddh, the second power supply voltage Vdd, and the reference voltage Vref. The first assist circuit ASC1 may generate the assist signal AS based on the first and second power supply voltages Vddh and Vdd and the reference voltage Vref. The first assist circuit ASC1 may output the assist signal AS to the compensation circuit CC.

The first assist circuit ASC1 may include a third resistor R3, a fourth resistor R4, a determiner DET, and a first level shifter LS1.

The third resistor R3 may be connected between the power node of receiving the first power supply voltage Vddh and a ninth node N9. The fourth resistor R4 may be connected between the ninth node N9 and the ground node having the ground voltage GND.

In some embodiments, a ratio of a voltage of the ninth node N9 to the first power supply voltage Vddh may be a ratio of the fourth resistor R4 to a sum of the third resistor R3 and the fourth resistor R4. A voltage of the ninth node N9 may be proportional to the first power supply voltage Vddh. The voltage of the ninth node N9 determined by the third and fourth resistors R3 and R4 may be included in an operating range of the determiner DET.

The determiner DET may be driven by the second power supply voltage Vdd. The determiner DET may compare the reference voltage Vref and the voltage of the ninth node N9. The determiner DET may output a determination signal DS indicating the enable mode or the disable mode, based on a compared result.

In some embodiments, the determiner DET may perform a comparison operation based on the assist reference voltage Vas. For example, the determiner DET may have a threshold voltage corresponding to the assist reference voltage Vas. When a difference between the voltage of the ninth node N9 and the reference voltage Vref is smaller than the threshold voltage corresponding to the assist reference voltage Vas (e.g., when the first power supply voltage Vddh is low to such an extend so as to need the compensation of an internal voltage converter), the determiner DET may generate the determination signal DS indicating the enable mode.

For example, when the difference between the voltage of the ninth node N9 and the reference voltage Vref is greater than or equal to the threshold voltage corresponding to the assist reference voltage Vas (e.g., when the first power supply voltage Vddh is high to such an extent so as not to need the compensation of an internal voltage converter), the determiner DET may generate the determination signal DS indicating the disable mode.

In some embodiments, a voltage level of the determination signal DS indicating the enable mode may correspond to the ground voltage GND. A voltage level of the determination signal DS indicating the disable mode may correspond to the second power supply voltage Vdd.

The first level shifter LS1 may be driven by the first power supply voltage Vddh. The first level shifter LS1 may receive the determination signal DS from the determiner DET. The first level shifter LS1 may generate the assist signal AS, which may have a first voltage level indicating the enable mode or a second voltage level indicating the disable mode, based on the determination signal DS. The first level shifter LS1 may output the assist signal AS to the compensation circuit CC.

In some embodiments, the first voltage level of the assist signal AS indicating the enable mode may correspond to the ground voltage GND. The second voltage level of the assist signal AS indicating the disable mode may correspond to the first power supply voltage Vddh. For example, the first level shifter LS1 may generate the assist signal AS having the ground voltage GND, based on the determination signal DS having the ground voltage GND. The first level shifter LS1 may generate the assist signal AS having the first power supply voltage Vddh, based on the determination signal DS having the second power supply voltage Vdd.

As described above, according to some embodiments of the present disclosure, the first assist circuit ASC1 may generate the assist signal AS indicating the enable mode or the disable mode, based on a comparison result of the first power supply voltage Vddh and the assist reference voltage Vas. For example, when the first power supply voltage Vddh is lower than the assist reference voltage Vas, the first assist circuit ASC1 may determine the voltage level of the assist signal AS to correspond to a voltage level corresponding to the ground voltage GND indicating the enable mode. When the first power supply voltage Vddh is greater than or equal to the assist reference voltage Vas, the first assist circuit ASC1 may determine the voltage level of the assist signal AS to correspond to a voltage level corresponding to the first power supply voltage Vddh indicating the disable mode.

Figure 7:
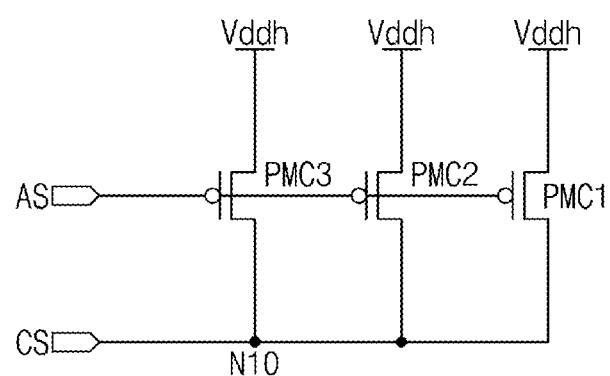
FIG. 7 is a circuit diagram illustrating a compensation circuit of FIG. 4 in detail, according to some embodiments of the present disclosure.

FIG. 7 is a circuit diagram illustrating a compensation circuit of FIG. 4 in detail, according to some embodiments of the present disclosure. Referring to FIGS. 4 and 7, the compensation circuit CC may receive the first power supply voltage Vddh. The compensation circuit CC may receive the assist signal AS from the first assist circuit ASC1. The compensation circuit CC may generate a compensation signal CS based on the assist signal AS. The compensation circuit CC may compensate for the regulated voltage Vrg based on the compensation signal CS.

The compensation circuit CC may include first, second, and third compensation PMOS transistors PMC1, PMC2, and PMC3. The first, second, and third compensation PMOS transistors PMC1, PMC2, and PMC3 may be connected between the power node of receiving the first power supply voltage Vddh and a tenth node N10 at which the compensation signal CS is generated. The first, second, and third compensation PMOS transistors PMC1, PMC2, and PMC3 may operate in response to the assist signal AS. The first, second, and third compensation PMOS transistors PMC1, PMC2, and PMC3 may be connected in parallel.

In some embodiments, the number of compensation PMOS transistors connected between the power node that receives the first power supply voltage Vddh and the tenth node N10 at which the compensation signal CS is generated may increase or decrease. In other words, to assist in better understanding of the present disclosure, an example in which the compensation circuit CC includes three compensation PMOS transistors PMC1, PMC2, and PMC3 is illustrated in FIG. 7, but the present disclosure is not limited thereto. For example, in some embodiments the number of compensation PMOS transistors may be greater than or less than three.

As the number of compensation PMOS transistors decreases, the size of the compensation circuit CC may decrease, as the number of compensation PMOS transistors increases, the size of the compensation circuit CC may increase. As the number of compensation PMOS transistors increases, it may be advantageous to compensate for the regulated voltage Vrg of the first internal voltage converter IVC1 and to drive the charge pump circuit CP.

In some embodiments, the compensation circuit CC may compensate for a current capacity of the first internal voltage converter IVC1. For example, referring to FIGS. 4, 5, and 7, the current capacity of the first internal voltage converter IVC1 may be restricted by the first PMOS transistor PM1 of the first internal voltage converter IVC1. The tenth node N10 of the compensation circuit CC may be connected with the first node N1 of the first internal voltage converter IVC1. The compensation PMOS transistors PMC1, PMC2, and PMC3 of the compensation circuit CC may provide a driving current to the first node N1 of the first internal voltage converter IVC1. As such, the current capacity of the first internal voltage converter IVC1 may be compensated for. The first internal voltage converter IVC1 whose current capacity is compensated for may provide a driving current for charge pumping to the charge pump circuit CP.

In some embodiments, the compensation circuit CC may operate in the enable mode or the disable mode, based on the assist signal AS. For example, referring to FIGS. 6 and 7, when the assist signal AS has a voltage level of the ground voltage GND indicating the enable mode, the compensation PMOS transistors PMC1, PMC2, and PMC3 may be turned on in response to the ground voltage GND applied to gate terminals thereof, and the compensation PMOS transistors PMC1, PMC2, and PMC3 may provide drain currents to the tenth node N10. When the assist signal AS has a voltage level of the first power supply voltage Vddh indicating the disable mode, the compensation PMOS transistors PMC1, PMC2, and PMC3 may be turned off in response to the first power supply voltage Vddh applied to the gate terminals thereof, and the compensation PMOS transistors PMC1, PMC2, and PMC3 may not provide drain currents to the tenth node N10.

Figure 8:
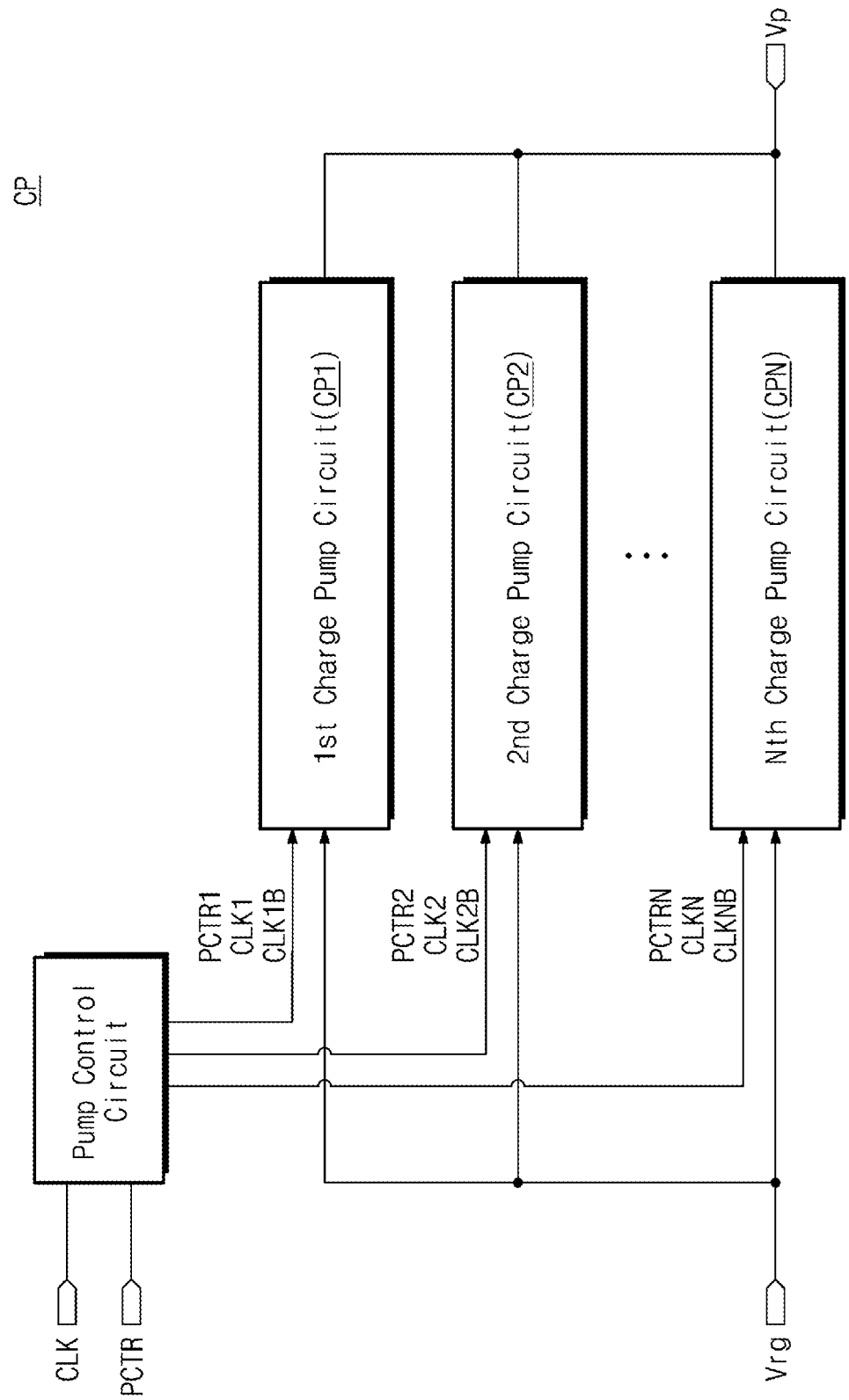
FIG. 8 is a circuit diagram illustrating a charge pump circuit of FIG. 4 in detail, according to some embodiments of the present disclosure.

FIG. 8 is a circuit diagram illustrating a charge pump circuit of FIG. 4 in greater detail, according to some embodiments of the present disclosure. Referring to FIGS. 4 and 8, the charge pump circuit CP may receive the clock signal CLK and the pump control signal PCTR. The charge pump circuit CP may receive the regulated voltage Vrg from the first internal voltage converter IVC1. The regulated voltage Vrg may be compensated for by the compensation circuit CC. The charge pump circuit CP may generate the pump voltage Vp based on the clock signal CLK, the pump control signal PCTR, and the regulated voltage Vrg. A voltage level of the pump voltage Vp may be higher than a voltage level of the regulated voltage Vrg. In some embodiments, the pump voltage Vp may be used in the write operation.

The charge pump circuit CP may include a pump control circuit, and first to N-th charge pump circuits CP1 to CPN, where "N" is a natural number.

The pump control circuit may generate first to N-th clock signals CLK1 to CLKN based on the clock signal CLK. The first to N-th clock signals CLK1 to CLKN may be used to control a part of transistors of the first to N-th charge pump circuits CP1 to CPN.

The pump control circuit may generate first to N-th clock-bar signals CLK1B to CLKNB based on the clock signal CLK. A logic state of voltage levels of the first to N-th clock-bar signals CLK1B to CLKNB may be complementary to a logic state of voltage levels of the first to N-th clock signals CLK1 to CLKN. In other words, when the logic state of one the first to N-th clock signals CLK1 to CLKN is a "high" logic state (e.g., "1"), then the logic state of the respective first to N-th clock-bar signals CLK1B to CLKNB is a "low" logic state (e.g., "0"). The first to N-th clock-bar signals CLK1B to CLKNB may be used to control the remaining part of the transistors of the first to N-th charge pump circuits CP1 to CPN.

The pump control circuit may generate first to N-th pump control signals PCTR1 to PCTRN based on the pump control signal PCTR. The first to N-th pump control signals PCTR1 to PCTRN may control whether to perform charge pumping of the first to N-th charge pump circuits CP1 to CPN. For example, the first to N-th pump control signals PCTR1 to PCTRN may control whether to provide the regulated voltage Vrg to each of the first to N-th charge pump circuits CP1 to CPN.

The first charge pump circuit CP1 may perform charge pumping on the regulated voltage Vrg, based on the first clock signal CLK1, the first clock-bar signal CLK1B, and the first pump control signal PCTR1. As in the above description, the second charge pump circuit CP2 may perform charge pumping, based on the second clock signal CLK2, the second clock-bar signal CLK2B, and the second pump control signal PCTR2. The N-th charge pump circuit CPN may perform charge pumping, based on the N-th clock signal CLKN, the N-th clock-bar signal CLKNB, and the N-th pump control signal PCTRN. The pump voltage Vp may be generated based on the charge pumping of the first to N-th charge pump circuits CP1 to CPN.

In some embodiments, the first to N-th clock signals CLK1 to CLKN may have different phase delay values. Likewise, the first to N-th clock-bar signals CLK1B to CLKNB may have different phase delay values. For example, when "N" is 4, phase delay values of the first to fourth clock signals CLK1 to CLK4 may be 0 degree, 90 degrees, 180 degrees, and 270 degrees, respectively. The voltage levels of the first to N-th clock-bar signals CLK1B to CLKNB may be complementary to the voltage levels of the first to N-th clock signals CLK1 to CLKN. The fluctuations of a voltage level of the pump voltage Vp due to the charge pumping may decrease by performing the charge pumping based on clock signals having different phase delay values. Accordingly, the reliability of the write operation in a non-volatile memory device may be improved.

Figure 9:
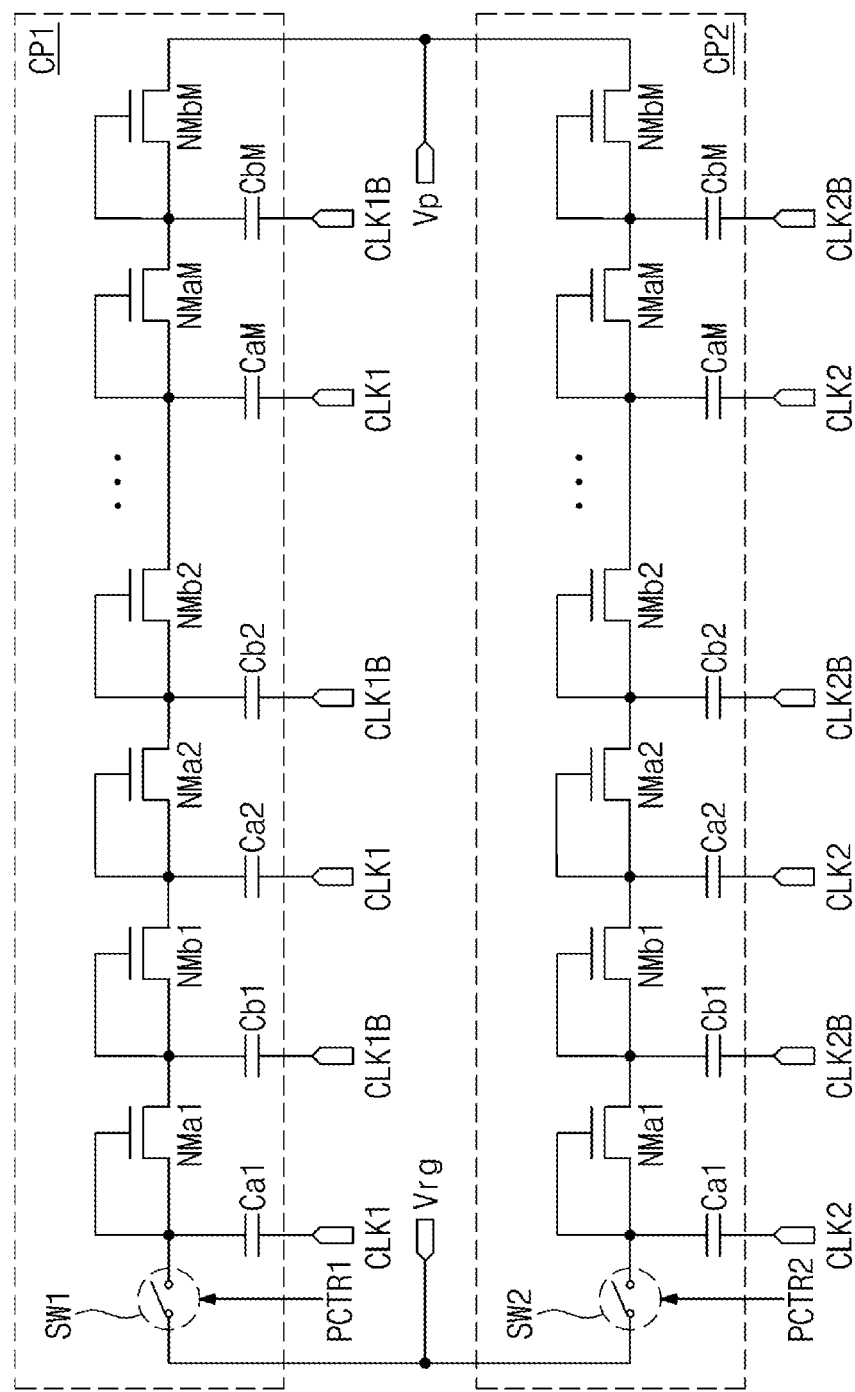
FIG. 9 is a circuit diagram illustrating charge pump circuits of FIG. 8 in detail, according to some embodiments of the present disclosure.

FIG. 9 is a circuit diagram illustrating charge pump circuits of FIG. 8 in greater detail, according to some embodiments of the present disclosure. Referring to FIGS. 8 and 9, a circuit diagram of the first charge pump circuit CP1 and the second charge pump circuit CP2 is illustrated. To prevent a drawing from being complicated, only the first and second charge pump circuits CP1 and CP2 are illustrated in FIG. 9, but the present disclosure is not limited thereto. For example, other charge pump circuits may be further added in parallel between a node of receiving the regulated voltage Vrg and a node at which the pump voltage Vp is generated.

Alternatively, the second charge pump circuit CP2 may be omitted to reduce the size of a non-volatile memory device.

The first charge pump circuit CP1 and the second charge pump circuit CP2 may be connected in parallel between the node of receiving the regulated voltage Vrg and the node at which the pump voltage Vp is generated.

The first charge pump circuit CP1 may receive the first pump control signal PCTR1, the first clock signal CLK1, the first clock-bar signal CLK1B, and the regulated voltage Vrg. The first charge pump circuit CP1 may perform charge pumping on the regulated voltage Vrg, based on the first pump control signal PCTR1, the first clock signal CLK1, and the first clock-bar signal CLK1B. The pump voltage Vp may be generated based on the charge pumping of the first charge pump circuit CP1.

The first charge pump circuit CP1 may include a first switch SW1 and a first to "2M" transistors NMa1 to NMaM and NMb1 to NMbM, which are connected in series between the node of receiving the regulated voltage Vrg and the node at which the pump voltage Vp is generated. "M" is a natural number. The first charge pump circuit CP1 may further include capacitors Ca1 to CaM and Cb1 to CbM respectively corresponding to the transistors NMa1 to NMaM and NMb1 to NMbM. Here, the transistors NMa1 to NMaM are odd-numbered transistors performing charge pumping on the regulated voltage Vrg, from among the first to "2M" transistors NMa1 to NMaM and NMb1 to NMbM. The transistors NMb1 to NMbM are even-numbered transistors performing charge pumping on the regulated voltage Vrg, from among the first to "2M" transistors NMa1 to NMaM and NMb1 to NMbM.

In the first charge pump circuit CP1, the first switch SW1 may output the regulated voltage Vrg to the transistor NMa1 based on the first pump control signal PCTR1. The transistors NMa1 to NMaM may be controlled by the first clock signal CLK1. For example, the first clock signal CLK1 may control the transistors NMa1 to NMaM through the capacitors Ca1 to CaM to perform charge pumping. The transistors NMb1 to NMbM may be controlled by the first clock-bar signal CLK1B. For example, the first clock-bar signal CLK1B may control the transistors NMb1 to NMbM through the capacitors Cb1 to CbM to perform charge pumping. However, the present disclosure is not limited to this example. For example, in some embodiments and unlike the example illustrated in FIG. 9, the first charge pump circuit CP1 may be designed such that the first clock signal CLK1 controls the transistors NMb1 to NMbM and the first clock-bar signal CLK1B controls the transistors NMa1 to NMaM.

The second charge pump circuit CP2 may receive the second pump control signal PCTR2, the second clock signal CLK2, the second clock-bar signal CLK2B, and the regulated voltage Vrg. The second charge pump circuit CP2 may perform charge pumping on the regulated voltage Vrg, based on the second pump control signal PCTR2, the second clock signal CLK2, and the second clock-bar signal CLK2B. The pump voltage Vp may be generated based on the charge pumping of the second charge pump circuit CP2.

The second charge pump circuit CP2 may include a second switch SW2 and the first to "2M" transistors NMa1 to NMaM and NMb1 to NMbM, which are connected in series between the node of receiving the regulated voltage Vrg and the node at which the pump voltage Vp is generated. The second charge pump circuit CP2 may further include capacitors Ca1 to CaM and Cb1 to CbM respectively corresponding to the transistors NMa1 to NMaM and NMb1 to NMbM. Operations of the second switch SW2 and the first to "2M" transistors NMa1 to NMaM and NMb1 to NMbM are similar to those described with reference to the first charge pump circuit CP1, and thus, additional description will be omitted to avoid redundancy.

In some embodiments, a charge pump circuit may be implemented based on NMOS transistors, or may be implemented based on PMOS transistors. For example, the first and second charge pump circuits CP1 and CP2 may be implemented based on NMOS transistors connected in series as illustrated in FIG. 9, but the present disclosure is not limited thereto. Unlike the example illustrated in FIG. 9, the first and second charge pump circuits CP1 and CP2 may be implemented based on PMOS transistors connected in series.

Figure 10:
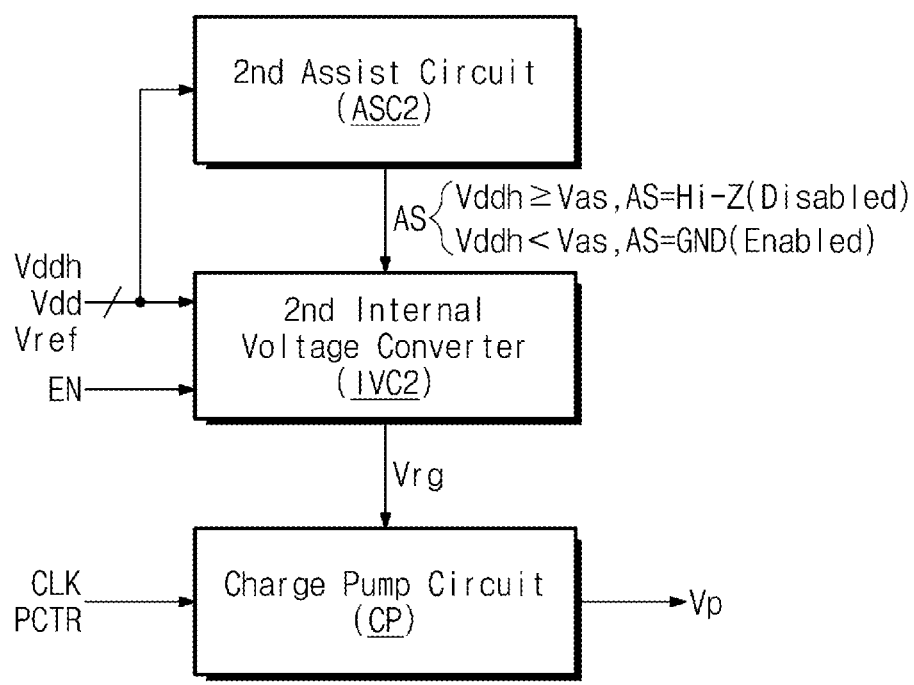
FIG. 10 is a block diagram describing a voltage generating circuit according to some embodiments of the present disclosure.

FIG. 10 is a block diagram describing a voltage generating circuit according to some embodiments of the present disclosure. A block diagram of a voltage generating circuit 121b is illustrated in FIG. 10. The voltage generating circuit 121b may correspond to the voltage generating circuit 121 of FIGS. 1 and 2. The voltage generating circuit 121b may include a second internal voltage converter IVC2, a second assist circuit ASC2, and the charge pump circuit CP. In contrast to the voltage generating circuit VGC of FIG. 3, the voltage generating circuit 121b may further include the second assist circuit ASC2, and in contrast to the voltage generating circuit 121a of FIG. 4, the voltage generating circuit 121b may not include the compensation circuit CC. The charge pump circuit CP is similar to the charge pump circuit CP of FIG. 4, and thus, additional description will be omitted to avoid redundancy.

The voltage generating circuit 121b may receive the first power supply voltage Vddh, the second power supply voltage Vdd, the reference voltage Vref, the enable signal EN, the clock signal CLK, and the pump control signal PCTR. The voltage generating circuit 121b may generate the pump voltage Vp. Characteristics of the first power supply voltage Vddh, the second power supply voltage Vdd, the reference voltage Vref, the enable signal EN, the clock signal CLK, the pump control signal PCTR, and the pump voltage Vp are similar to those described with reference to FIG. 4, and thus, additional description will be omitted to avoid redundancy.

The second assist circuit ASC2 may receive the first power supply voltage Vddh, the second power supply voltage Vdd, and the reference voltage Vref. The second assist circuit ASC2 may include the assist reference voltage Vas. The second assist circuit ASC2 may compare the first power supply voltage Vddh and the assist reference voltage Vas. The second assist circuit ASC2 may generate the assist signal AS based on a comparison result of the first power supply voltage Vddh and the assist reference voltage Vas. The second assist circuit ASC2 may output the assist signal AS to the second internal voltage converter IVC2.

In some embodiments, the second assist circuit ASC2 may generate the assist signal AS indicating the enable mode or the disable mode. The enable mode may indicate a mode in which the compensation for the regulated voltage Vrg of the second internal voltage converter IVC2 is made. The disable mode may indicate a mode in which the compensation for the regulated voltage Vrg of the second internal voltage converter IVC2 is not made.

In some embodiments, when the first power supply voltage Vddh is lower than the assist reference voltage Vas, the second assist circuit ASC2 may generate the assist signal AS indicating the enable mode. For example, a voltage level of the assist signal AS indicating the enable mode may be a voltage level of a ground voltage GND.

In some embodiments, when the first power supply voltage Vddh is greater than or equal to the assist reference voltage Vas, the second assist circuit ASC2 may generate the assist signal AS indicating the disable mode. For example, a voltage level of the assist signal AS indicating the disable mode may correspond to a high impedance (Hi-Z) state.

The second internal voltage converter IVC2 may receive the first and second power supply voltages Vddh and Vdd, the reference voltage Vref, and the enable signal EN. The second internal voltage converter IVC2 may receive the assist signal AS from the second assist circuit ASC2. The second internal voltage converter IVC2 may operate in the enable mode or the disable mode, based on the assist signal AS. In the enable mode, the second internal voltage converter IVC2 may activate a bypass path to bias an internal transistor. This will be more fully described with reference to FIG. 11. In the disable mode, an operation of the second internal voltage converter IVC2 may be similar to that of the first internal voltage converter IVC1 of FIGS. 4 and 5.

The second internal voltage converter IVC2 may use the first and second power supply voltages Vddh and Vdd as driving voltages. In the enable mode or the disable mode, the second internal voltage converter IVC2 may generate the regulated voltage Vrg having a voltage level corresponding to the reference voltage Vref, in response to the enable signal EN. The second internal voltage converter IVC2 may output the regulated voltage Vrg to the charge pump circuit CP.

In some embodiments, the second internal voltage converter IVC2 may operate in the enable mode by the second assist circuit ASC2, and thus, a driving margin may decrease. In general, a voltage drop may occur while the second internal voltage converter IVC2 performs the regulating operation. The second assist circuit ASC2 may allow the second internal voltage converter IVC2 to operate in the enable mode through the assist signal AS and thus may compensate for the voltage drop of the second internal voltage converter IVC2. As such, the second internal voltage converter IVC2 may decrease or omit (or remove) the driving margin.

In some embodiments, the second assist circuit ASC2 may allow the second internal voltage converter IVC2 to operate in the enable mode and thus may compensate for a current capacity of the second internal voltage converter IVC2. For example, the second assist circuit ASC2 may bias an internal transistor of the second internal voltage converter IVC2 and thus may increase the intensity or magnitude of a driving current that the second internal voltage converter IVC2 provides to the charge pump circuit CP.

As described above, according to some embodiments of the present disclosure, there may be provided the voltage generating circuit 121b that compensates for the regulated voltage Vrg of the second internal voltage converter IVC2 through the second assist circuit ASC2. Because the voltage drop is compensated for, the driving margin may be minimized, and thus, the second internal voltage converter IVC2 may operate at the first power supply voltage Vddh of a wide range. Also, while improving a voltage level of the regulated voltage Vrg and maintaining an identical voltage level requirement of the pump voltage Vp, the size of the charge pump circuit CP may be minimized, and thus, the size of the voltage generating circuit 121b may decrease. Also, as the voltage generating circuit 121b is implemented without a separate compensation circuit providing a driving current to the charge pump circuit CP, the size of the voltage generating circuit 121b may be smaller than the size of the voltage generating circuit 121a of FIG. 4.

Figure 11:
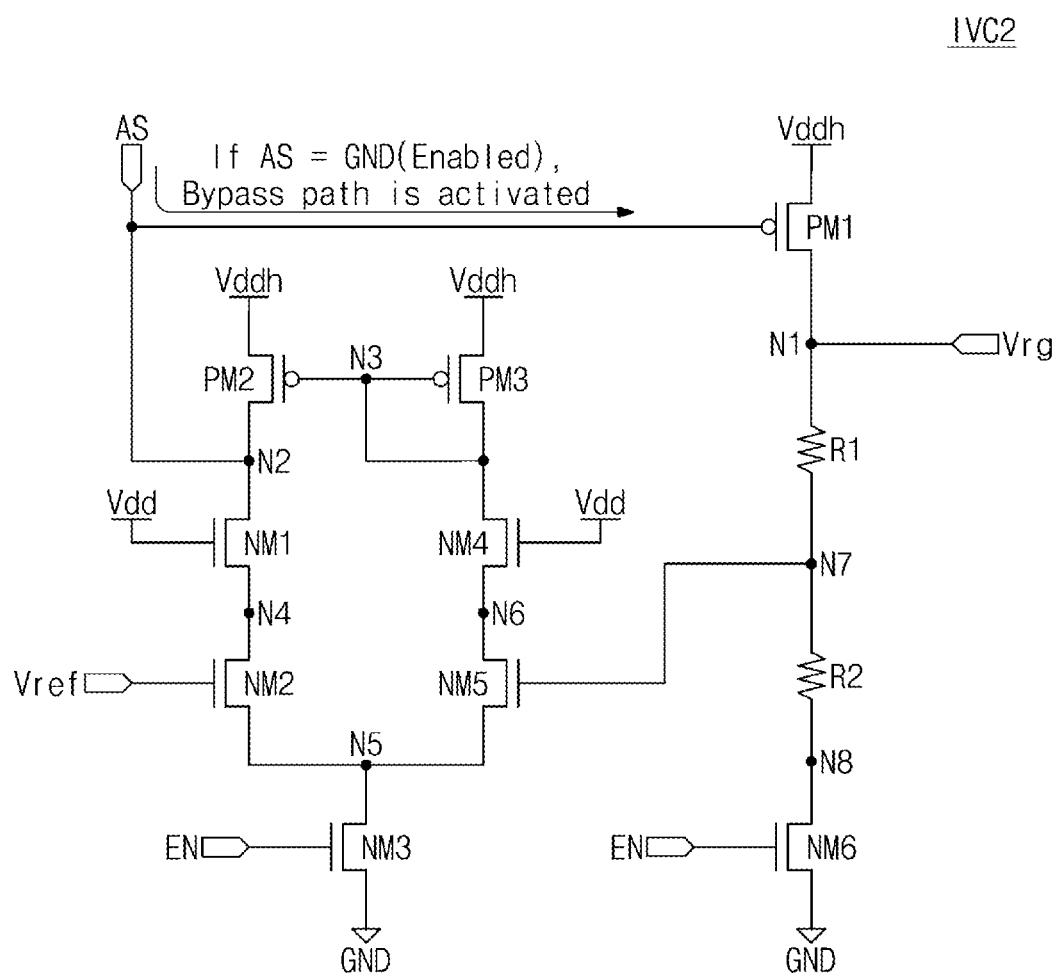
FIG. 11 is a circuit diagram illustrating a second internal voltage converter of FIG. 10 in detail, according to some embodiments of the present disclosure.

FIG. 11 is a circuit diagram illustrating a second internal voltage converter of FIG. 10 in detail, according to some embodiments of the present disclosure. Returning to FIGS. 10 and 11, the second internal voltage converter IVC2 may receive the first and second power supply voltages Vddh and Vdd, the reference voltage Vref, the enable signal EN, and the assist signal AS. The second internal voltage converter IVC2 may generate the regulated voltage Vrg. The first node N1 at which the regulated voltage Vrg is generated may be connected with the charge pump circuit CP.

The second internal voltage converter IVC2 may include the first, second, and third PMOS transistors PM1, PM2, and PM3, the first, second, third, fourth, fifth, and sixth NMOS transistors NM1, NM2, NM3, NM4, NM5, and NM6, and the first and second resistors R1 and R2. The second and third PMOS transistors PM2 and PM3, the first, second, third, fourth, fifth, and sixth NMOS transistors NM1, NM2, NM3, NM4, NM5, and NM6, and the first and second resistors R1 and R2 are similar to those described with reference to FIG. 5, and thus, additional description will be omitted to avoid redundancy.

The first PMOS transistor PM1 may be connected between the power node configured to receive first power supply voltage Vddh and the first node N1. The first node N1 may be a node at which the regulated voltage Vrg is generated. The first PMOS transistor PM1 may operate in response to a voltage of the second node N2. The second node N2 may be connected with the second PMOS transistor PM2 and the first NMOS transistor NM1. The second node N2 may be configured to receive the assist signal AS.

In some embodiments, the second internal voltage converter IVC2 may generate the regulated voltage Vrg based on a bypass path or a feedback path. The bypass path may correspond to the enable mode, and the feedback path may correspond to the disable mode.

For example, when the assist signal AS indicates the enable mode, regardless of operations of the second PMOS transistor PM2 and the first NMOS transistor NM1 and voltage drops, a gate terminal of the first PMOS transistor PM1 may be biased such that the ground voltage GND is applied thereto. The first PMOS transistor PM1 may generate the regulated voltage Vrg based on the bypass path which is directly controlled by the assist signal AS.

For example, when the assist signal AS indicates the disable mode, the first PMOS transistor PM1 may generate the regulated voltage Vrg based on the feedback path in which a voltage of the first node N1 has an influence on a voltage of the second node N2.

In some embodiments, as the assist signal AS activates the bypass path, a voltage drop of the second internal voltage converter IVC2 may be compensated for. For example, when the bypass path is not activated, a voltage of the second node N2, which is determined based on the transistors NM1, NM2, NM3, and PM2, may be higher than the ground voltage GND. When the bypass path is activated, the gate terminal of the first PMOS transistor PM1 may be biased such that the ground voltage GND is applied thereto. As a lower voltage is applied to the gate terminal of the first PMOS transistor PM1, a voltage drop between a source terminal and a drain terminal of the first PMOS transistor PM1 may be decreased. That is, based on the bypass path, the first PMOS transistor PM1 may generate the regulated voltage Vrg whose voltage level is similar to that of the first power supply voltage Vddh. A driving margin between the first power supply voltage Vddh and the regulated voltage Vrg may be decreased.

In some embodiments, as the assist signal AS activates the bypass path, the assist signal AS may compensate for a current capacity of the second internal voltage converter IVC2. For example, when the bypass path is activated, the gate terminal of the first PMOS transistor PM1 may be biased such that the ground voltage GND is applied thereto. As a lower voltage is applied to the gate terminal of the first PMOS transistor PM1, a drain current of the first PMOS transistor PM1 may increase. That is, a driving current that the first PMOS transistor PM1 provides to the charge pump circuit CP through the first node N1 may be increased by the bypass path.

In some embodiments, the second internal voltage converter IVC2 may further include another PMOS transistor connected in parallel with the first PMOS transistor PM1. For example, even though the ground voltage GND may be applied to the gate terminal of the first PMOS transistor PM1, compensation for the regulated voltage Vrg may be further required depending on the charge pump circuit CP. At least one other PMOS transistor (not illustrated) may be further provided between the power node configured to receive the first power supply voltage Vddh and the first node N1 so as to be connected in parallel with the first PMOS transistor PM1. At least one other gate terminal of the at least one other PMOS transistor thus connected may be configured to receive the assist signal AS.

As described above, as the second internal voltage converter IVC2 may be configured such that the ground voltage GND is applied to the first PMOS transistor PM1 based on the assist signal AS, a driving margin of the second internal voltage converter IVC2 may decrease, and a current capacity of the second internal voltage converter IVC2 may increase.

Figure 12:
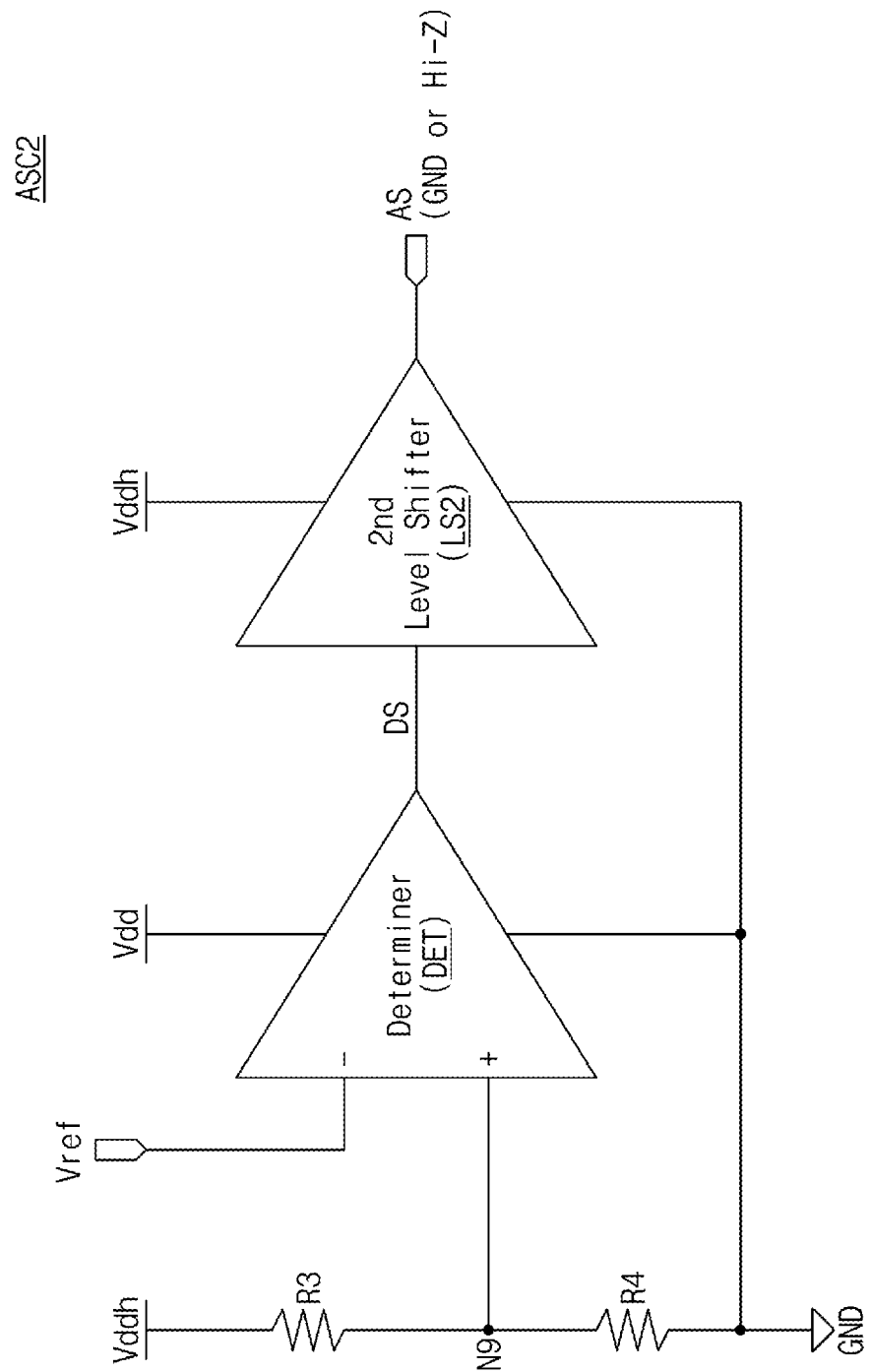
FIG. 12 is a circuit diagram illustrating a second assist circuit of FIG. 10 in detail, according to some embodiments of the present disclosure.

FIG. 12 is a circuit diagram illustrating a second assist circuit of FIG. 10 in detail, according to some embodiments of the present disclosure. Referring to FIGS. 10 and 12, the second assist circuit ASC2 may receive the first and second power supply voltages Vddh and Vdd, and the reference voltage Vref. The second assist circuit ASC2 may generate the assist signal AS based on the first and second power supply voltages Vddh and Vdd and the reference voltage Vref. The second assist circuit ASC2 may output the assist signal AS to the second internal voltage converter IVC2.

The second assist circuit ASC2 may include the third resistor R3, the fourth resistor R4, the determiner DET, and a second level shifter LS2. Characteristics of the first and second power supply voltages Vddh and Vdd, the reference voltage Vref, the third and fourth resistors R3 and R4, and the determiner DET are similar to those described with reference to FIG. 6, and thus, additional description will be omitted to avoid redundancy.

The second level shifter LS2 may be driven by the first power supply voltage Vddh. The second level shifter LS2 may receive the determination signal DS from the determiner DET. The second level shifter LS2 may generate the assist signal AS, which has the first voltage level indicating the enable mode or the second voltage level indicating the disable mode, based on the determination signal DS. For example, the first voltage level indicating the enable mode may correspond to the ground voltage GND. The second voltage level indicating the disable mode may correspond to a high impedance (Hi-Z) state. The second level shifter LS2 may output the assist signal AS to the second internal voltage converter IVC2.

Figure 13:
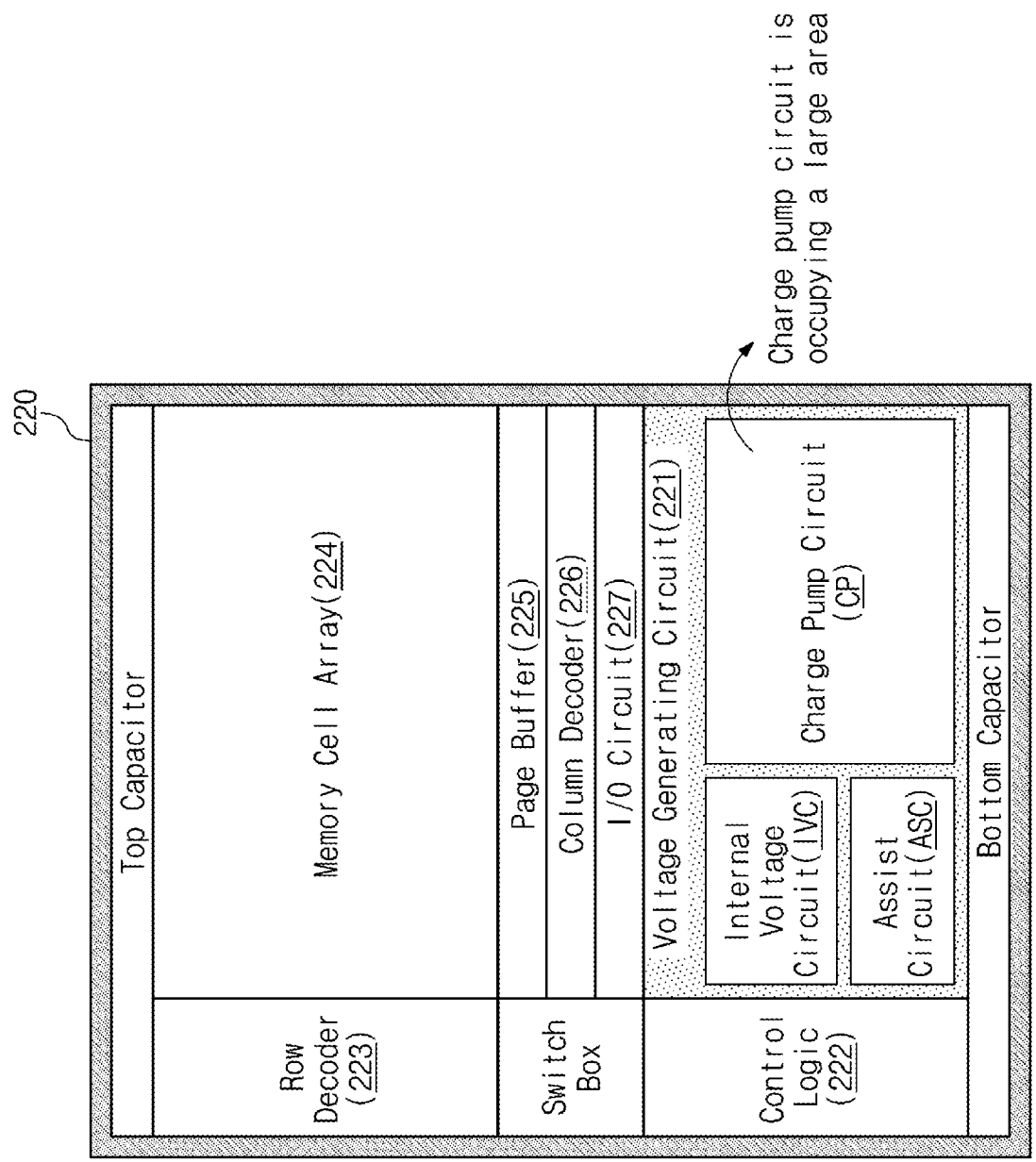
FIG. 13 is a diagram describing a non-volatile memory device according to some embodiments of the present disclosure.

FIG. 13 is a diagram describing a non-volatile memory device according to some embodiments of the present disclosure. Referring to FIG. 13, a non-volatile memory device 220 implemented with a memory chip is illustrated by way of example. The non-volatile memory device 220 may correspond to the non-volatile memory device 120 of FIGS. 1 and 2.

The non-volatile memory device 220 may include a voltage generating circuit 221, control logic 222, a row decoder 223, a memory cell array 224, a page buffer 225, a column decoder 226, an I/O circuit 227, a top capacitor, a bottom capacitor, and a switch box. The control logic 222, the row decoder 223, the memory cell array 224, the page buffer 225, the column decoder 226, and the I/O circuit 227 may each be similar respectively to the control logic 122, the row decoder 123, the memory cell array 124, the page buffer 125, the column decoder 126, and the I/O circuit 127 of FIG. 2, and thus, additional description will be omitted to avoid redundancy. The switch box may include a plurality of switches configured to connect sub-components of the non-volatile memory device 220.

The voltage generating circuit 221 may include an internal voltage converter IVC, an assist circuit ASC, and a charge pump circuit CP. In some embodiments, the charge pump circuit CP of the voltage generating circuit 221 may occupy the area that is physically wide. The size of the charge pump circuit CP may have a large influence on the size of the non-volatile memory device 220. As an amplification ratio of the charge pump circuit CP increases, the size of the charge pump circuit CP or the number of transistors therein may increase, and thus, the size of the charge pump circuit CP may increase. In other words, increasing the amplification ratio of the charge pump circuit CP may hinder the miniaturization of the non-volatile memory device 220.

Meanwhile, referring to FIGS. 4, 10, and 13, the voltage generating circuit 121a and the voltage generating circuit 121b may compensate for the regulated voltage Vrg to be provided to the charge pump circuit CP. In the case where the voltage generating circuit 221 is implemented to be similar to the voltage generating circuit 121a or the voltage generating circuit 121b, the charge pump circuit CP may have a higher current driving capacity under the same amplification ratio. Alternatively, the charge pump circuit CP may be implemented in a smaller size while maintaining an voltage level requirement of the pump voltage Vp that is identical.

That is, according to embodiments of the present disclosure, by compensating a voltage drop and a current capacity of the internal voltage converter IVC based on the assist circuit ASC, it may be possible to reduce the size of the charge pump circuit CP or to increase a voltage level of the pump voltage Vp that the charge pump circuit CP generates.

Figure 14:
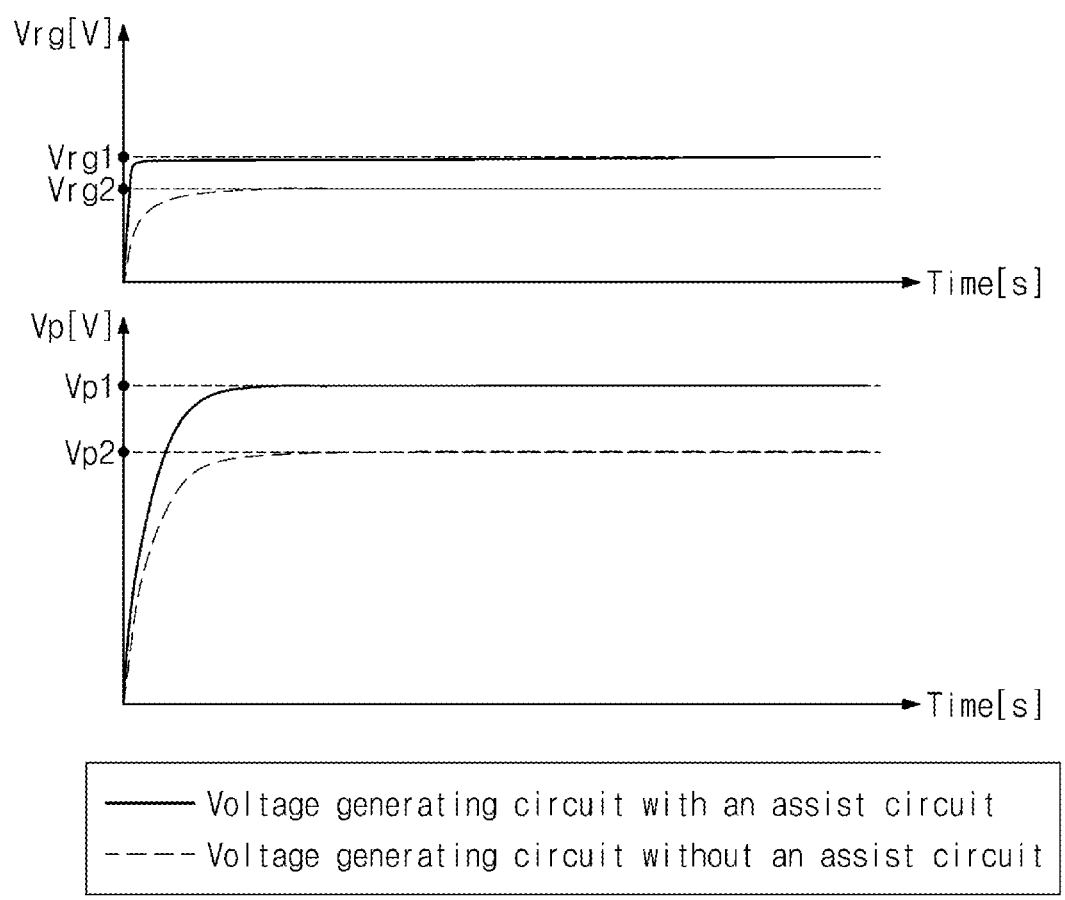
FIG. 14 is a graph illustrating waveforms of a regulated voltage and a pump voltage according to some embodiments of the present disclosure.

FIG. 14 is a graph illustrating waveforms of a regulated voltage and a pump voltage according to some embodiments of the present disclosure. Waveforms of the regulated voltage Vrg and the pump voltage Vp are illustrated in FIG. 14. In FIG. 14, a horizontal axis denotes a time, and a vertical axis denotes a magnitude of a voltage level.

In FIG. 14, solid lines indicate waveforms of the regulated voltage Vrg and the pump voltage Vp in a voltage generating circuit including an assist circuit. The voltage generating circuit including the assist circuit may correspond to the voltage generating circuit 121 of FIGS. 1 and 2, the voltage generating circuit 121a of FIG. 4, or the voltage generating circuit 121b of FIG. 10. In FIG. 14, dashed lines indicate waveforms of the regulated voltage Vrg and the pump voltage Vp in a voltage generating circuit not including an assist circuit. The voltage generating circuit not including the assist circuit may correspond to the voltage generating circuit VGC of FIG. 3.

Referring to the waveforms of the regulated voltage Vrg, a regulated voltage in an embodiment in which an assist circuit is included may be higher than a regulated voltage in an example in which an assist circuit is not included. For example, the regulated voltage in the embodiment in which the assist circuit is included may converge into a first regulated voltage Vrg1. The regulated voltage in the example in which the assist circuit is not included may converge into a second regulated voltage Vrg2. The first regulated voltage Vrg1 may be higher than the second regulated voltage Vrg2.

Referring to the waveforms of the pump voltage Vp, a pump voltage in the embodiment in which the assist circuit is included may be higher than a regulated voltage in the example in which the assist circuit is not included. For example, the regulated voltage in the embodiment in which the assist circuit is included may converge into a first pump voltage Vp1. The regulated voltage in the example in which the assist circuit is not included may converge into a second pump voltage Vp2. The first pump voltage Vp1 may be higher than the second pump voltage Vp2. That is, by adding an assist circuit to a voltage generating circuit, it may be possible to generate the pump voltage Vp having a higher voltage level.

Figure 15:
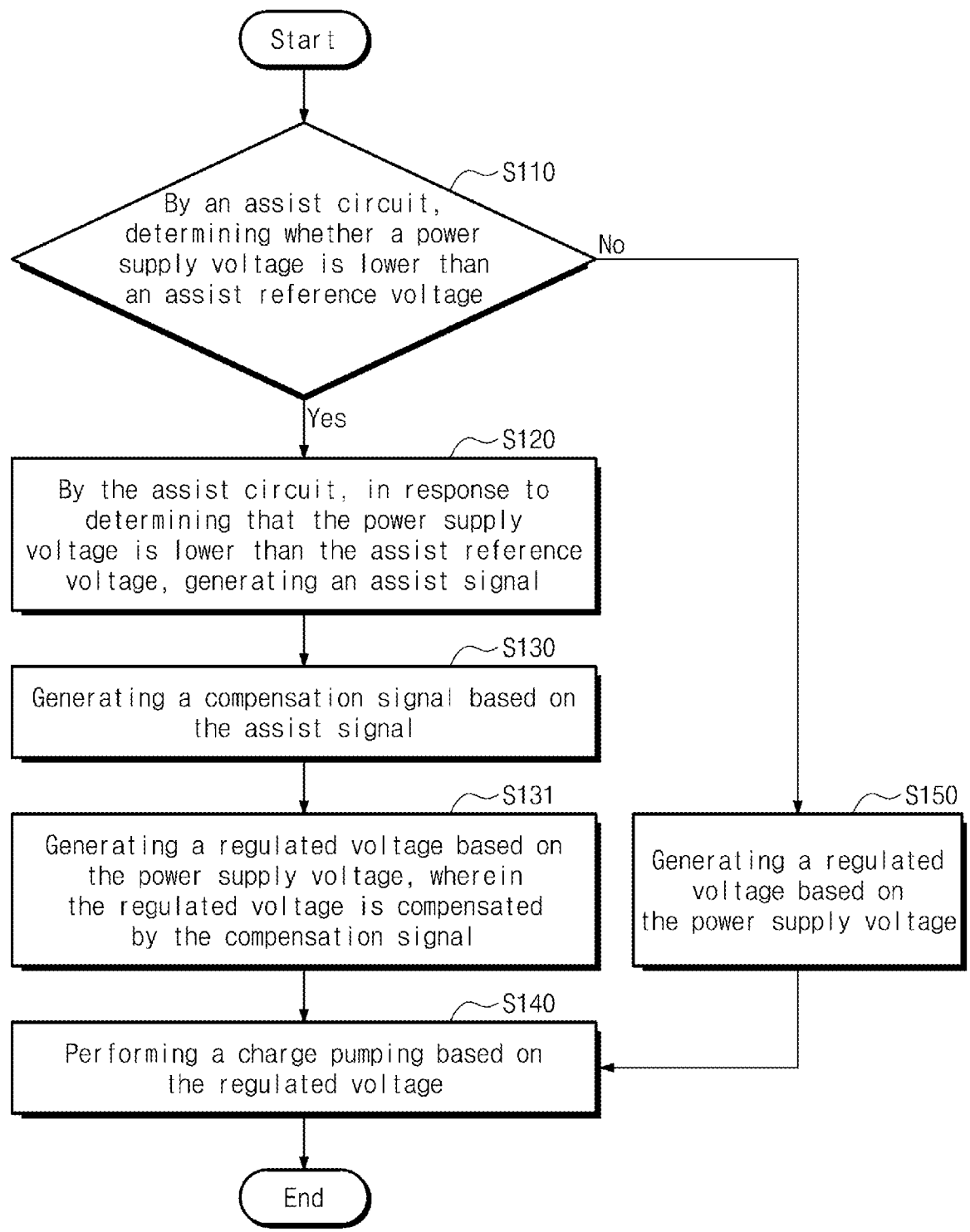
FIG. 15 is a flowchart describing an operating method of a voltage generating circuit according to some embodiments of the present disclosure.

FIG. 15 is a flowchart describing an operating method of a voltage generating circuit according to some embodiments of the present disclosure. An operating method of a voltage generating circuit will be described with reference to FIG. 15. The voltage generating circuit may correspond to the voltage generating circuit 121 of FIGS. 1 and 2 or the voltage generating circuit 121a of FIG. 4. The voltage generating circuit may include an assist circuit.

In operation S110, the voltage generating circuit may determine whether a power supply voltage is lower than an assist reference voltage, by using the assist circuit. The assist reference voltage may be used to determine whether to compensate for a voltage drop due to a regulating operation of the voltage generating circuit. When it is determined in operation S110 that the power supply voltage is lower than the assist reference voltage ("Yes" branch from operation S110), the voltage generating circuit may perform operation S120.

In operation S120, by using the assist circuit, the voltage generating circuit may generate an assist signal in response to determining that the power supply voltage is lower than the assist reference voltage. In some embodiments, the assist circuit may generate the assist signal indicating the enable mode, in response to determining that the power supply voltage is lower than the assist reference voltage. The assist signal indicating the enable mode may have a voltage level of a ground voltage.

In operation S130, the voltage generating circuit may generate a compensation signal based on the assist signal. In some embodiments, the voltage generating circuit may further include a compensation circuit. The compensation circuit may include at least one transistor generating the compensation signal in response to the assist signal.

In operation S131, the voltage generating circuit may generate a regulated voltage based on the power supply voltage. In this case, the regulated voltage may be compensated for by the compensation signal in operation S130. In some embodiments, the compensation circuit of the voltage generating circuit may compensate for the regulated voltage. The compensation circuit may output the compensation signal to a node at which the regulated voltage is generated.

In operation S140, the voltage generating circuit may perform charge pumping based on the regulated voltage in operation S131.

When it is determined in operation S110 that the power supply voltage is greater than or equal to the assist reference voltage ("No" branch from operation S110), the voltage generating circuit may perform operation S150. In operation S150, the voltage generating circuit may generate the regulated voltage based on the power supply voltage. In this case, the regulated voltage may not be compensated for by the compensation signal. In operation S140, the voltage generating circuit may perform charge pumping based on the regulated voltage in operation S150.

Figure 16:
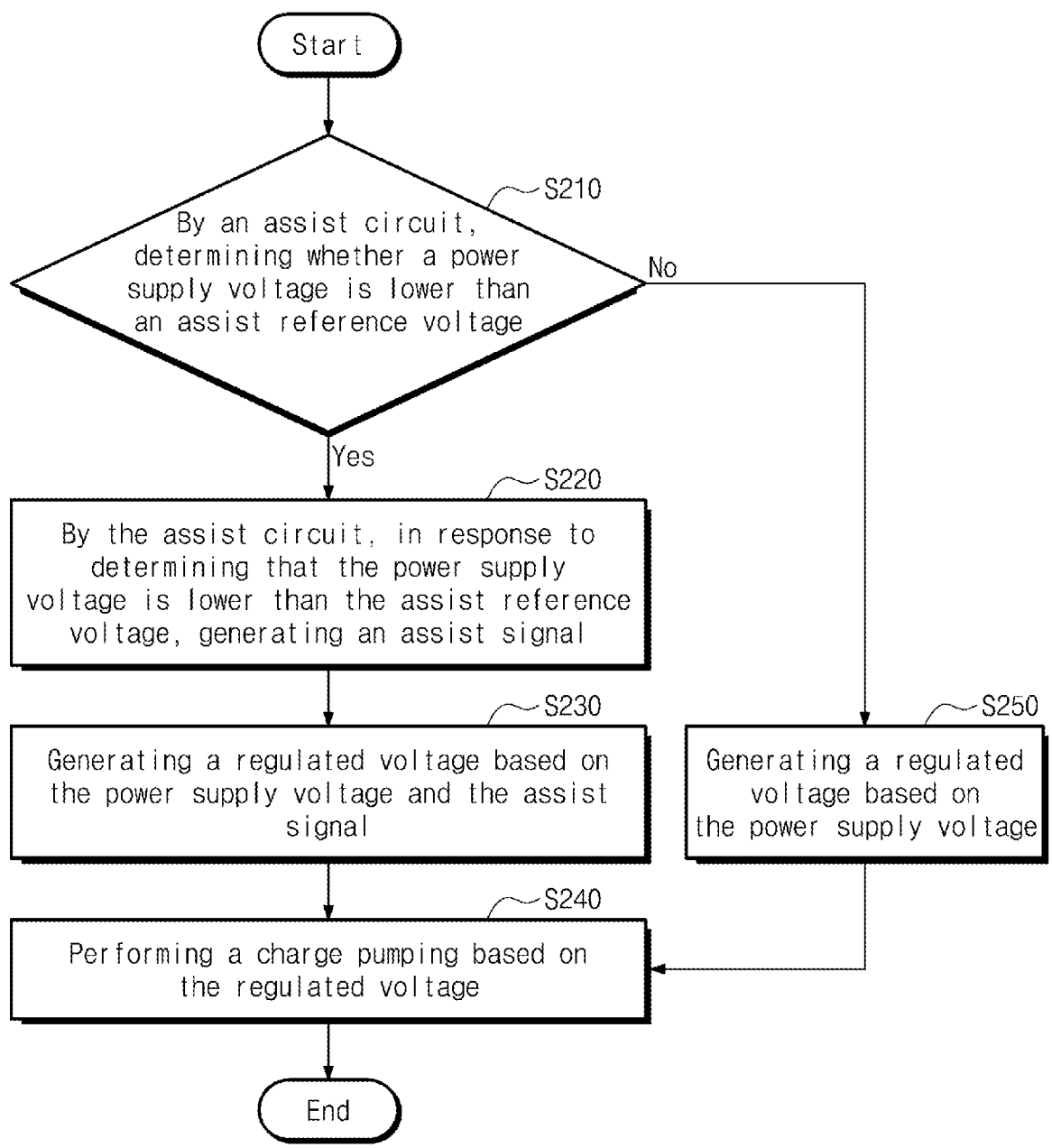
FIG. 16 is a flowchart describing an operating method of a voltage generating circuit according to some embodiments of the present disclosure.

FIG. 16 is a flowchart describing an operating method of a voltage generating circuit according to some embodiments of the present disclosure. An operating method of a voltage generating circuit will be described with reference to FIG. 16. The voltage generating circuit may correspond to the voltage generating circuit 121 of FIGS. 1 and 2 and the voltage generating circuit 121b of FIG. 10. The voltage generating circuit may include an assist circuit.

In operation S210, the voltage generating circuit may determine whether a power supply voltage is lower than an assist reference voltage, by using the assist circuit. When it is determined in operation S210 that the power supply voltage is lower than the assist reference voltage ("Yes" branch from operation S210), the voltage generating circuit may perform operation S220.

In operation S220, by using the assist circuit, the voltage generating circuit may generate an assist signal in response to determining that the power supply voltage is lower than the assist reference voltage. In some embodiments, the assist circuit may generate the assist signal indicating the enable mode, in response to determining that the power supply voltage is lower than the assist reference voltage. The assist signal indicating the enable mode may have a voltage level of a ground voltage.

In operation S230, the voltage generating circuit may generate a regulated voltage based on the power supply voltage and the assist signal. The regulated voltage may be compensated for based on the assist signal. In some embodiments, the assist signal may directly control an internal voltage converter of the voltage generating circuit. For example, the assist signal may bias a transistor connected with a node of the internal voltage converter, at which the regulated voltage is generated. A voltage drop and a current capacity of the internal voltage converter may be compensated for by the biasing. In operation S240, the voltage generating circuit may perform charge pumping based on the regulated voltage in operation S230.

When it is determined in operation S210 that the power supply voltage is greater than or equal to the assist reference voltage ("No" branch from operation S210), the voltage generating circuit may perform operation S250. In operation S250, the voltage generating circuit may generate the regulated voltage based on the power supply voltage. In this case, the regulated voltage may not be compensated for by the assist signal. In operation S240, the voltage generating circuit may perform charge pumping based on the regulated voltage in operation S250.

Figure 17:
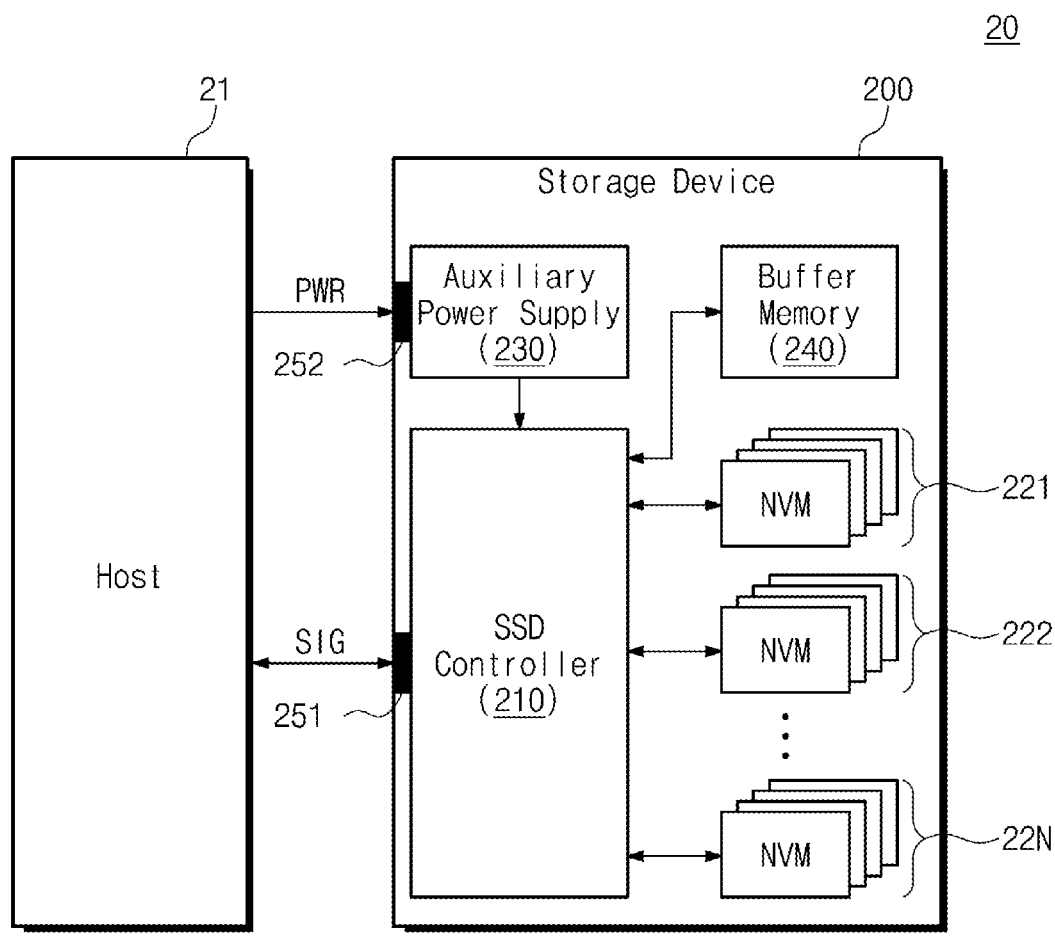
FIG. 17 is a block diagram of a solid state drive (SSD) system to which a storage device according to some embodiments of the present disclosure is applied.

FIG. 17 is a block diagram of a solid state drive (SSD) system to which a storage device according to some embodiments of the present disclosure is applied. Referring to FIG. 17, an SSD system 20 may include a host 21 and a storage device 200. The storage device 200 may exchange a signal SIG with the host 21 through a signal connector 251 and may receive a power PWR through a power connector 252. The storage device 200 may correspond to the storage device 100 of FIG. 1.

The storage device 200 may include an SSD controller 210, a plurality of non-volatile memories 221 to 22N, an auxiliary power supply 230, and a buffer memory 240.

The SSD controller 210 may control the plurality of non-volatile memories 221 to 22N in response to the signal SIG from the host 21. The plurality of non-volatile memories 221 to 22N may operate under control of the SSD controller 210.

In some embodiments, each of the plurality of non-volatile memories 221 to 22N may include a voltage generating circuit. For example, each of the plurality of non-volatile memories 221 to 22N may include the voltage generating circuit 121a of FIG. 4, the voltage generating circuit 121b of FIG. 10, a voltage generating circuit performing the operating method of FIG. 15, and/or a voltage generating circuit performing the operating method of FIG. 16.

The auxiliary power supply 230 may be connected with the host 21 through the power connector 252. The auxiliary power supply 230 may be charged by or supplied with the power PWR from the host 21. When the power is not smoothly supplied from the host 21, the auxiliary power supply 230 may provide a power for driving the SSD system 200. The buffer memory 240 may be used as a buffer memory of the storage device 200.

Figure 18:
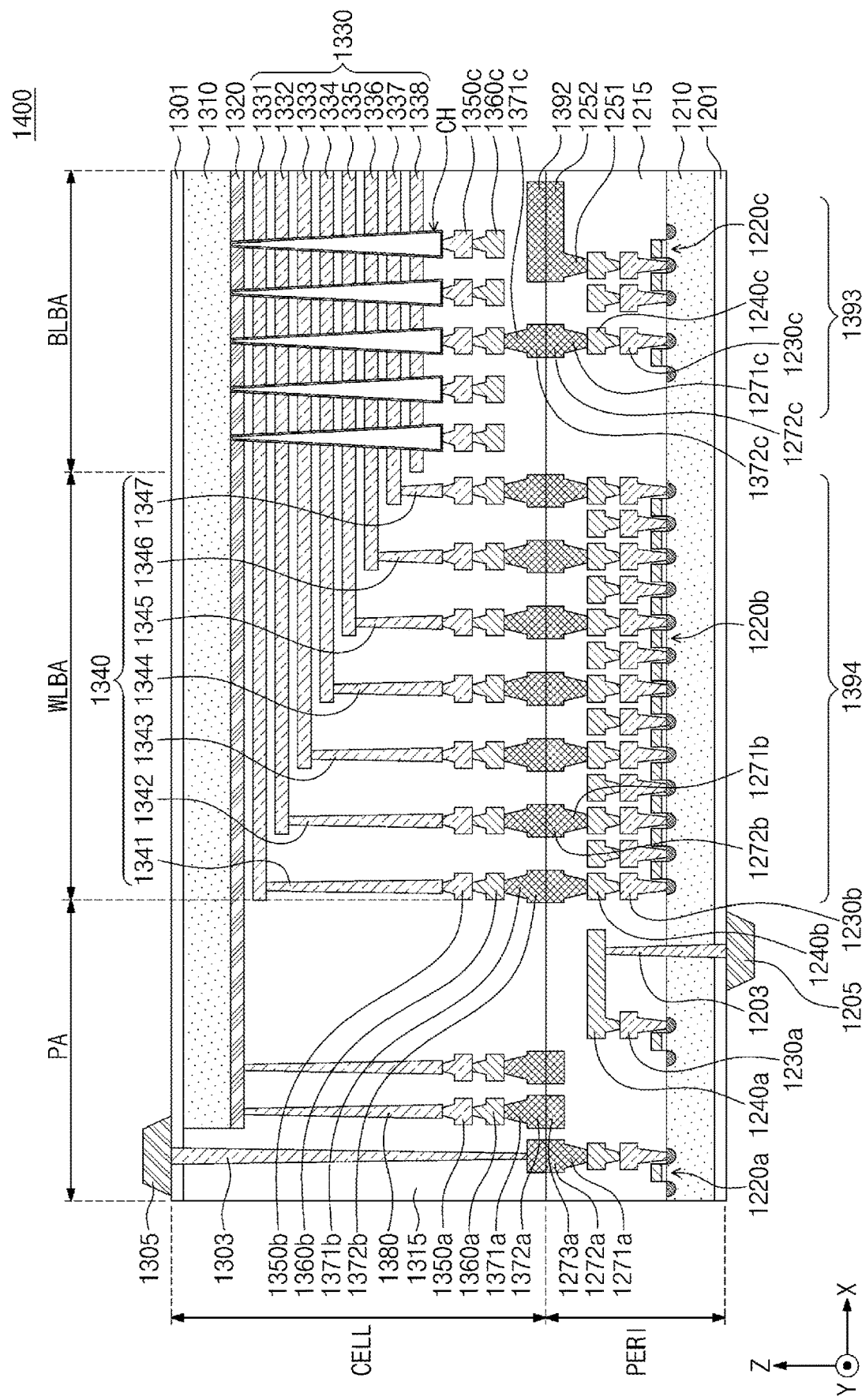
FIG. 18 is a diagram describing a memory device implemented with BVNAND according to some embodiments of the present disclosure.

FIG. 18 is a diagram illustrating a non-volatile memory device implemented with BVNAND, according to some embodiments of the present disclosure. Referring to FIG. 18, a memory device 1400 may be implemented with BVNAND. The memory device 1400 may correspond to the non-volatile memory device 120 of FIGS. 1 and 2.

The memory device 1400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The present disclosure is not limited thereto, however. For example, the bonding metals may also be formed of aluminum (Al) or tungsten (W).

Each of the peripheral circuit region PERI and the cell region CELL of the memory device 1400 may include an external pad bonding area PA, a word line bonding area WLBA, and a bit line bonding area BLBA.

The peripheral circuit region PERI may include a first substrate 1210, an interlayer insulating layer 1215, a plurality of circuit elements 1220a, 1220b, and 1220c formed on the first substrate 1210, first metal layers 1230a, 1230b, and 1230c respectively connected to the plurality of circuit elements 1220a, 1220b, and 1220c, and second metal layers 1240a, 1240b, and 1240c formed on the first metal layers 1230a, 1230b, and 1230c. In some example embodiments, the first metal layers 1230a, 1230b, and 1230c may be formed of tungsten having relatively high electrical resistivity, and the second metal layers 1240a, 1240b, and 1240c may be formed of copper having relatively low electrical resistivity.

In the example embodiment illustrated in FIG. 18, although only the first metal layers 1230a, 1230b, and 1230c and the second metal layers 1240a, 1240b, and 1240c are shown and described, with the understanding that the present disclosure is not limited thereto, and one or more additional metal layers may be further formed on the second metal layers 1240a, 1240b, and 1240c. At least a portion of the one or more additional metal layers formed on the second metal layers 1240a, 1240b, and 1240c may be formed of aluminum or the like having a lower electrical resistivity than those of copper forming the second metal layers 1240a, 1240b, and 1240c.

The interlayer insulating layer 1215 may be on the first substrate 1210 and may cover the plurality of circuit elements 1220a, 1220b, and 1220c, the first metal layers 1230a, 1230b, and 1230c, and the second metal layers 1240a, 1240b, and 1240c. The interlayer insulating layer 1215 may include an insulating material such as silicon oxide, silicon nitride, or the like.

Lower bonding metals 1271b and 1272b may be formed on the second metal layer 1240b in the word line bonding area WLBA. In the word line bonding area WLBA, the lower bonding metals 1271b and 1272b in the peripheral circuit region PERI may be electrically bonded to upper bonding metals 1371b and 1372b of the cell region CELL. The lower bonding metals 1271b and 1272b and the upper bonding metals 1371b and 1372b may be formed of aluminum, copper, tungsten, or the like.

The cell region CELL may include at least one memory block. The cell region CELL may include a second substrate 1310 and a common source line 1320. On the second substrate 1310, a plurality of word lines 1331 to 1338 (i.e., 1330) may be stacked in a direction (a Z-axis direction), perpendicular to an upper surface of the second substrate 1310. At least one string select line and at least one ground select line may be arranged on and below the plurality of word lines 1330, respectively, and the plurality of word lines 1330 may be between the at least one string select line and the at least one ground select line.

In the bit line bonding area BLBA, a channel structure CH may extend in a direction (e.g., a vertical or Z-axis direction) that is perpendicular to the upper surface of the second substrate 1310. The channel structure CH may pass through the plurality of word lines 1330, the at least one string select line, and the at least one ground select line. The channel structure CH may include a data storage layer, a channel layer, a buried insulating layer, and the like, and the channel layer may be electrically connected to a first metal layer 1350c and a second metal layer 1360c. For example, the first metal layer 1350c may be a bit line contact, and the second metal layer 1360c may be a bit line. In some example embodiments, the second metal layer 1360c may extend in a Y-axis direction that is parallel to the upper surface of the second substrate 1310.

In the example embodiment illustrated in FIG. 18, an area in which the channel structure CH, the second metal layer 1360c, and the like are arranged may be defined as the bit line bonding area BLBA. In the bit line bonding area BLBA, the second metal layer 1360c may be electrically connected to the circuit elements 1220c providing a page buffer 1393 in the peripheral circuit region PERI. The second metal layer 1360c may be connected to upper bonding metals 1371c and 1372c in the cell region CELL, and the upper bonding metals 1371c and 1372c may be connected to lower bonding metals 1271c and 1272c connected to the circuit elements 1220c of the page buffer 1393.

In the word line bonding area WLBA, the plurality of word lines 1330 may extend in a second direction (an X-axis direction), parallel to the upper surface of the second substrate 1310 and perpendicular to the first direction, and may be connected to a plurality of cell contact plugs 1341 to 1347 (i.e., 1340). The plurality of word lines 1330 and the plurality of cell contact plugs 1340 may be connected to each other in pads provided by at least a portion of the plurality of word lines 1330 extending in different lengths in the X-axis direction. A first metal layer 1350b and a second metal layer 1360b may be connected sequentially to an upper portion of the plurality of cell contact plugs 1340 connected to the plurality of word lines 1330. The plurality of cell contact plugs 1340 may be connected to the peripheral circuit region PERI by the upper bonding metals 1371b and 1372b of the cell region CELL and the lower bonding metals 1271b and 1272b of the peripheral circuit region PERI in the word line bonding area WLBA.

The plurality of cell contact plugs 1340 may be electrically connected to the circuit elements 1220b forming a row decoder 1394 in the peripheral circuit region PERI. In some example embodiments, operating voltages of the circuit elements 1220b of the row decoder 1394 may be different than operating voltages of the circuit elements 1220c forming the page buffer 1393. For example, operating voltages of the circuit elements 1220c forming the page buffer 1393 may be greater than operating voltages of the circuit elements 1220b forming the row decoder 1394.

A common source line contact plug 1380 may be arranged in the external pad bonding area PA. The common source line contact plug 1380 may be formed of a conductive material such as a metal, a metal compound, polysilicon, or the like, and may be electrically connected to the common source line 1320. A first metal layer 1350a and a second metal layer 1360a may be stacked sequentially on an upper portion of the common source line contact plug 1380. For example, an area in which the common source line contact plug 1380, the first metal layer 1350a, and the second metal layer 1360a are arranged may be defined as the external pad bonding area PA.

Input-output pads 1205 and 1305 may be arranged in the external pad bonding area PA. A lower insulating film 1201 that covers a lower surface of the first substrate 1210 may be formed below the first substrate 1210, and a first input-output pad 1205 may be formed on the lower insulating film 1201. The first input-output pad 1205 may be connected to at least one of the plurality of circuit elements 1220a, 1220b, and 1220c arranged in the peripheral circuit region PERI through a first input-output contact plug 1203, and may be separated from the first substrate 1210 by the lower insulating film 1201. In addition, a side insulating film may be between the first input-output contact plug 1203 and the first substrate 1210 to electrically separate the first input-output contact plug 1203 and the first substrate 1210.

An upper insulating film 1301 covering the upper surface of the second substrate 1310 may be formed on the second substrate 1310, and a second input-output pad 1305 may be on the upper insulating layer 1301. The second input-output pad 1305 may be connected to at least one of the plurality of circuit elements 1220a, 1220b, and 1220c in the peripheral circuit region PERI through a second input-output contact plug 1303. In the example embodiment of FIG. 18, the second input-output pad 1305 is electrically connected to a circuit element 1220a.

According to some example embodiments, the second substrate 1310 and the common source line 1320 may not be present in an area in which the second input-output contact plug 1303 is arranged. Also, the second input-output pad 1305 may not overlap the word lines 1330 in the Z-axis direction. The second input-output contact plug 1303 may be separated from the second substrate 1310 in a direction, parallel to the upper surface of the second substrate 1310, and may pass through the interlayer insulating layer 1315 of the cell region CELL to be connected to the second input-output pad 1305.

According to some example embodiments, the first input-output pad 1205 and the second input-output pad 1305 may be formed selectively and/or optionally. For example, the memory device 1400 may include only either the first input-output pad 1205 on the first substrate 1210 or the second input-output pad 1305 on the second substrate 1310. Alternatively, the memory device 1400 may include both the first input-output pad 1205 and the second input-output pad 1305.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 1400 may include a lower metal pattern 1273a, corresponding to an upper metal pattern 1372a formed in an uppermost metal layer of the cell region CELL, and having the same cross-sectional shape as the upper metal pattern 1372a of the cell region CELL so as to be connected to each other, in an uppermost metal layer of the peripheral circuit region PERI. In the peripheral circuit region PERI, the lower metal pattern 1273a formed in the uppermost metal layer of the peripheral circuit region PERI may not be connected to a contact. Similarly, in the external pad bonding area PA, an upper metal pattern 1372a, corresponding to the lower metal pattern 1273a formed in an uppermost metal layer of the peripheral circuit region PERI, and having the same shape as a lower metal pattern 1273a of the peripheral circuit region PERI, may be formed in an uppermost metal layer of the cell region CELL.

The lower bonding metals 1271b and 1272b may be formed on the second metal layer 1240b in the word line bonding area WLBA. In the word line bonding area WLBA, the lower bonding metals 1271b and 1272b of the peripheral circuit region PERI may be electrically connected to the upper bonding metals 1371b and 1372b of the cell region CELL by a Cu-to-Cu bonding or other bonding.

Further, in the bit line bonding area BLBA, an upper metal pattern 1392, corresponding to a lower metal pattern 1252 formed in the uppermost metal layer of the peripheral circuit region PERI, and having the same cross-sectional shape as the lower metal pattern 1252 of the peripheral circuit region PERI, may be formed in an uppermost metal layer of the cell region CELL. A contact may not be formed on the upper metal pattern 1392 formed in the uppermost metal layer of the cell region CELL.

In some example embodiments, the peripheral circuit region PERI of the memory device 1400 may include a voltage generating circuit. For example, the peripheral circuit region PERI of the memory device 1400 may include the voltage generating circuit 121a of FIG. 4, the voltage generating circuit 121b of FIG. 10, a voltage generating circuit performing the operating method of FIG. 15, and/or a voltage generating circuit performing the operating method of FIG. 16.

In some embodiments, the memory device 1400 in which the size of the peripheral circuit region PERI is reduced may be provided. For example, the peripheral circuit region PERI of the memory device 1400 may include a voltage generating circuit. The voltage generating circuit may compensate for a regulated voltage. While maintaining a voltage level requirement of a pump voltage as identical, as the regulated voltage is compensated for, the size of a charge pump circuit in the voltage generating circuit may decrease. The decrease in the size of the charge pump circuit may enable a decrease in the size of the peripheral circuit region PERI of the memory device 1400.

As described above, a storage device according to an embodiment of the present disclosure may be implemented with the SSD system of FIG. 17 or the BVNAND of FIG. 18. However, the present disclosure is not limited thereto. For example, unlike the storage device 200 of FIG. 17 or the memory device 1400 of FIG. 18, the storage device according to an embodiment of the present disclosure may be implemented based on a NOR flash memory or may be implemented with an integrated circuit (IC) including an embedded flash (eFlash) memory or a microcontroller unit (MCU), as examples.

According to some embodiments of the present disclosure, voltage generating circuits including assist circuits and operating methods thereof are provided.

Also, the present disclosure provides a voltage generating circuit, which may operate at a power supply voltage within a relatively wide range by compensating for a voltage drop therein, and which has a reduced size because a size of a charge pump circuit therein is reduced, and an operating method thereof.

While the present disclosure has been described with reference to some embodiments thereof, it will be apparent to those of ordinary skill in the art that various changes and modifications may be made thereto without departing from the scope of the present disclosure as set forth in the following claims.

What is claimed is:

1. A voltage generating circuit comprising:
   an assist circuit configured to generate an assist signal indicating an enable mode, when a first power supply voltage is lower than an assist reference voltage;
   a compensation circuit configured to receive the first power supply voltage and generate a compensation signal based on the first power supply voltage, based on the assist signal indicating the enable mode;
   an internal voltage converter configured to receive the first power supply voltage and generate a regulated voltage based on the first power supply voltage; and
   a charge pump circuit configured to generate a pump voltage based on the regulated voltage and based on the compensation signal,
   wherein the compensation signal compensates the regulated voltage.

2. The voltage generating circuit of claim 1, wherein the compensation circuit is further configured to:
   compensate for a current capacity of the internal voltage converter by providing a driving current for charge pumping to the charge pump circuit based on the compensation signal.

3. The voltage generating circuit of claim 1, wherein the internal voltage converter is further configured to:
   generate the regulated voltage based on an enable signal that controls a regulating operation, based on the first power supply voltage, based on a second power supply voltage lower than the first power supply voltage, and based on a reference voltage corresponding to the regulated voltage.

4. The voltage generating circuit of claim 3, wherein the internal voltage converter includes:
   a first PMOS transistor connected between a power node configured to receive the first power supply voltage and a first node at which the regulated voltage is generated, and configured to operate in response to a voltage of a second node;
   a second PMOS transistor connected between the power node and the second node, and configured to operate in response to a voltage of a third node;
   a third PMOS transistor connected between the power node and the third node, and configured to operate in response to the voltage of the third node;
   a first NMOS transistor connected between the second node and a fourth node, and configured to operate in response to the second power supply voltage;
   a second NMOS transistor connected between the fourth node and a fifth node, and configured to operate in response to the reference voltage;
   a third NMOS transistor connected between the fifth node and a ground node having a ground voltage, and configured to operate in response to the enable signal;
   a fourth NMOS transistor connected between the third node and a sixth node, and configured to operate in response to the second power supply voltage;
   a fifth NMOS transistor connected between the sixth node and the fifth node, and configured to operate in response to a voltage of a seventh node;
   a first resistor connected between the first node and the seventh node;
   a second resistor connected between the seventh node and an eighth node; and
   a sixth NMOS transistor connected between the eighth node and the ground node, and configured to operate in response to the enable signal.

5. The voltage generating circuit of claim 1, wherein the assist circuit is further configured to:
   when the first power supply voltage is lower than the assist reference voltage, set a voltage level of the assist signal as a first voltage level indicating the enable mode; and
   when the first power supply voltage is greater than or equal to the assist reference voltage, set the voltage level of the assist signal as a second voltage level indicating a disable mode.

6. The voltage generating circuit of claim 5, wherein the first voltage level corresponds to a ground voltage, and wherein the second voltage level corresponds to the first power supply voltage.

7. The voltage generating circuit of claim 1, wherein the assist circuit is further configured to:
   generate the assist signal based on the first power supply voltage, based on a second power supply voltage lower than the first power supply voltage, and based on a reference voltage corresponding to the regulated voltage, and
   wherein the assist circuit includes:
   a third resistor connected between a power node configured to receive the first power supply voltage and a ninth node;
   a fourth resistor connected between the ninth node and a ground node having a ground voltage;
   a determiner driven by the second power supply voltage, and configured to compare the reference voltage and a voltage of the ninth node and to output a determination signal indicating the enable mode or a disable mode; and a level shifter driven by the first power supply voltage, and configured to output, based on the determination signal, the assist signal having a first voltage level indicating the enable mode or a second voltage level indicating the disable mode.

8. The voltage generating circuit of claim 1, wherein the compensation circuit includes at least one fourth PMOS transistor connected between a power node configured to receive the first power supply voltage and a tenth node at which the compensation signal is generated, and
wherein each of the at least one fourth PMOS transistors operates in response to the assist signal.

9. The voltage generating circuit of claim 8, wherein the at least one fourth PMOS transistors comprises two or more fourth PMOS transistors connected between the power node and the tenth node.

10. The voltage generating circuit of claim 1, wherein the charge pump circuit is further configured to generate the pump voltage based on a clock signal, based on a pump control signal, and based on the regulated voltage, and
wherein the charge pump circuit includes:
a pump control circuit configured to generate first to N-th clock signals and first to N-th clock-bar signals based on the clock signal, and to generate first to N-th pump control signals based on the pump control signal; and
first to N-th charge pump circuits configured to independently perform charge pumping on the regulated voltage, based on the first to N-th clock signals, based on the first to N-th clock-bar signals, and based on the first to N-th pump control signals,
wherein "N" is a natural number.

11. The voltage generating circuit of claim 10, wherein the first charge pump circuit includes a switch and first to 2M-th transistors connected in series between a node configured to receive the regulated voltage and a node at which the pump voltage is generated,
wherein the switch is configured to output the regulated voltage to the first transistor based on the first pump control signal,
wherein odd-numbered transistors of the first to 2M-th transistors are controlled by the first clock signal,
wherein even-numbered transistors of the first to 2M-th transistors are controlled by the first clock-bar signal, and
wherein "M" is a natural number.

12. An operating method of a voltage generating circuit including an assist circuit, the method comprising:
determining, by the assist circuit, whether a power supply voltage is lower than an assist reference voltage;
generating, by the assist circuit, an assist signal indicating an enable mode in response to determining that the power supply voltage is lower than the assist reference voltage;
generating, by a compensation circuit that receives the power supply voltage, a compensation signal based on the assist signal;
generating, by an internal voltage converter that receives the power supply voltage, a regulated voltage based on the power supply voltage, the compensation signal, and the assist signal, wherein the regulated voltage is compensated for by the compensation signal; and
generating a pump voltage based on the regulated voltage.

13. The method of claim 12, wherein the generating of the assist signal includes:
generating, by the assist circuit, the assist signal having a voltage level that corresponds to a ground voltage, in response to the determining that the power supply voltage is lower than the assist reference voltage.

14. A voltage generating circuit comprising:
an assist circuit configured to generate an assist signal indicating an enable mode, when a first power supply voltage is lower than an assist reference voltage;
a compensation circuit configured to receive the first power supply voltage and generate a compensation signal based on the first power supply voltage, based on the assist signal indicating the enable mode;
an internal voltage converter configured to receive the first power supply voltage and generate a regulated voltage based on the first power supply voltage; and
a charge pump circuit configured to generate a pump voltage based on the regulated voltage and based on the compensation signal,
wherein the compensation signal compensates for a voltage drop of the internal voltage converter.

15. The voltage generating circuit of claim 14, wherein the internal voltage converter is further configured to:
generate the regulated voltage based on an enable signal that controls a regulating operation, based on the first power supply voltage, based on a second power supply voltage lower than the first power supply voltage, and based on a reference voltage corresponding to the regulated voltage.

16. The voltage generating circuit of claim 15, wherein the internal voltage converter includes:
a first PMOS transistor connected between a power node configured to receive the first power supply voltage and a first node at which the regulated voltage is generated, and configured to operate in response to a voltage of a second node;
a second PMOS transistor connected between the power node and the second node, and configured to operate in response to a voltage of a third node;
a third PMOS transistor connected between the power node and the third node, and configured to operate in response to the voltage of the third node;
a first NMOS transistor connected between the second node and a fourth node, and configured to operate in response to the second power supply voltage;
a second NMOS transistor connected between the fourth node and a fifth node, and configured to operate in response to the reference voltage;
a third NMOS transistor connected between the fifth node and a ground node having a ground voltage, and configured to operate in response to the enable signal;
a fourth NMOS transistor connected between the third node and a sixth node, and configured to operate in response to the second power supply voltage;
a fifth NMOS transistor connected between the sixth node and the fifth node, and configured to operate in response to a voltage of a seventh node;
a first resistor connected between the first node and the seventh node;
a second resistor connected between the seventh node and an eighth node; and
a sixth NMOS transistor connected between the eighth node and the ground node, and configured to operate in response to the enable signal.

17. The voltage generating circuit of claim 14, wherein the assist circuit is further configured to:
when the first power supply voltage is lower than the assist reference voltage, set a voltage level of the assist signal as a first voltage level indicating the enable mode; and when the first power supply voltage is greater than or equal to the assist reference voltage, set the voltage level of the assist signal as a second voltage level indicating a disable mode.

18. The voltage generating circuit of claim 17, wherein the first voltage level corresponds to a ground voltage, and wherein the second voltage level corresponds to the first power supply voltage.

19. The voltage generating circuit of claim 14, wherein the charge pump circuit is further configured to generate the pump voltage based on a clock signal, based on a pump control signal, and based on the regulated voltage, and
  wherein the charge pump circuit includes:
  a pump control circuit configured to generate first to N-th clock signals and first to N-th clock-bar signals based on the clock signal, and to generate first to N-th pump control signals based on the pump control signal; and
  first to N-th charge pump circuits configured to independently perform charge pumping on the regulated voltage, based on the first to N-th clock signals, based on the first to N-th clock-bar signals, and based on the first to N-th pump control signals,
  wherein "N" is a natural number.

* * * * *